United States Patent [19]
Yoneyama et al.

[11] Patent Number: 5,543,707
[45] Date of Patent: Aug. 6, 1996

[54] DIGITAL TESTER

[75] Inventors: Gen Yoneyama; Eiji Tsukahara, both of Nagano-ken, Japan

[73] Assignee: Seiko Epson Corporation, Tokyo, Japan

[21] Appl. No.: 438,274

[22] Filed: May 10, 1995

Related U.S. Application Data

[62] Division of Ser. No. 128,716, Sep. 30, 1993.

[30] Foreign Application Priority Data

| Sep. 30, 1992 | [JP] | Japan | 4-261295 |
| Dec. 28, 1992 | [JP] | Japan | 4-348264 |
| Dec. 28, 1992 | [JP] | Japan | 4-348265 |

[51] Int. Cl.[6] ............................................. G01R 15/08
[52] U.S. Cl. ................................... 324/115; 324/99 D
[58] Field of Search .................................. 324/115, 116, 324/72.5, 99 D, 103 R, 130, 133; 364/483, 481; 340/657, 660; 341/155

[56] References Cited

U.S. PATENT DOCUMENTS

| 4,321,530 | 3/1982 | Kelly et al. | 324/115 |
| 4,476,721 | 10/1984 | Hochreuther et al. | 324/115 |
| 4,520,310 | 5/1985 | Kelly et al. | 324/115 |
| 4,522,061 | 6/1985 | Hochreuther et al. | 324/115 |
| 4,696,189 | 9/1987 | Hochreuther | 324/115 |
| 5,119,019 | 6/1992 | George | 324/115 |
| 5,142,221 | 8/1992 | Meldrum et al. | 324/130 |
| 5,166,599 | 11/1992 | Hochreuther et al. | 324/115 |
| 5,250,893 | 10/1993 | Gambill et al. | 324/115 |

FOREIGN PATENT DOCUMENTS

| 0-097559 | 6/1983 | European Pat. Off. . | |
| 0471119A1 | 2/1992 | European Pat. Off. . | |
| 3409094 | 9/1985 | Germany | 324/156 |
| 1-22142 | 6/1989 | Japan . | |
| 2-150575 | 12/1990 | Japan . | |
| 3-101477 | 10/1991 | Japan . | |
| 1517930 | 7/1978 | United Kingdom . | |

*Primary Examiner*—Vinh P. Nguyen
*Attorney, Agent, or Firm*—Oliff & Berridge

[57] ABSTRACT

A digital tester includes structure for: automatically effecting AC/DC determination of an input signal and subsequent AC/DC switch-over of a measurement system, enabling high-response measurement; measuring a pulse width using a simple construction and having high reliability, by handling changes in an input potential as changes in potential zones; and storing the probes and test leads so that the digital tester is easier to handle for a higher degree of convenience in use.

18 Claims, 16 Drawing Sheets

DIGITAL TESTER

This is a Division of application Ser. No. 08/128,716 filed Sep. 30, 1993 (pending).

BACKGROUND OF THE INVENTION

1. Field of the Invention

The present invention relates to a digital tester, and more particularly to techniques for determining whether an input signal to the digital tester is AC or DC, for measuring a pulse width for an input potential to the digital tester, and further to a construction of a body of the digital tester.

2. Description of the Related Art

Digital testers as circuit meters have been popularly used in fault-location and in the service of electric and electronic equipment. Each tester incorporates a voltmeter, an ammeter, an ohmmeter, etc., has a wide range of measurement, and is easy to handle.

A digital tester has a measurement system that is generally switched over depending on whether an input signal is AC or DC. Therefore, digital testers are provided with a mode change switch for externally switching over the measurement system.

In use of digital testers, a pair of probes each provided with a measuring terminal at one end are employed, and test leads connected to the other ends of the probes are connected to a body of the digital tester. On the other hand, when carrying digital testers, the digital tester body is placed in a box case and the probes are stored by utilizing a gap left in the box case.

SUMMARY OF THE INVENTION

In a conventional digital tester, however, switching over the measurement system between the AC side and the DC side requires a user to recognize whether an input voltage, or the like, is AC or DC, by making a judgment from the circuit configuration and so on. This raises a first problem of rendering the digital tester inconvenient to those persons who do not have much electrical knowledge.

In view of the above first problem, a first object of the present invention is to provide a digital tester that can automatically effect AC/DC determination of an input signal and then switch over its measurement system between the AC side and the DC side with high responsivity.

With circuit configurations of more and more various equipment being designed in digital form, there increases the need for measuring a pulse width to check those circuit configurations. Nonetheless, a conventional digital tester is provided with no circuit for measuring a pulse width, which results in a second problem of rendering the digital tester inconvenient to those persons who are engaged in the design of digital circuits. The reason is in that measuring a pulse width requires a circuit for time-sharing an input signal, comparing changes in the input signal with each other from time to time, and detecting the rise and fall of a pulse, as well as a relay circuit. These circuits, however, could not be mounted in a circuit meter such as a small-sized digital tester.

In view of the above second problem, a second object of the present invention is to provide a digital tester that can measure a pulse width with simple construction and high reliability, by determining changes in an input potential as change-over of potential zones.

Furthermore, a conventional digital tester has a third problem in that the digital tester is not handy to use because probes are required to be stored along with a body of the digital tester in a box case whenever carried, or probes must be stored separately in spite of the digital tester body having a reduced size. Additionally, when probes are stored in a box case, they are often stored such that test leads are wrapped over probe grips. This condition of the stored test leads gives rise to another inconvenience in that the test leads must be unwrapped prior to using the digital tester.

In view of the above third problem, a third object of the present invention is to provide a digital tester in which the structure of a body of the digital tester is improved to ensure a higher degree of convenience in such a point of making probes easier to handle.

To solve the above first problem, one embodiment of a digital tester according to the present invention includes a high-speed A/D converter able to operate at a high speed for converting an input signal into digital form and outputting it as an AC/DC determination signal. The digital tester also includes an AC/DC determining unit for comparing a level of the input signal with a DC determination range defined by positive and negative thresholds based on the AC/DC determination signal. The AC/DC determining unit determines the input signal to be AC when the level of the input signal has exceeded the DC determination range on both the positive and negative sides for a predetermined comparison period, and issues determination signals corresponding to AC and DC based on this determination. The digital tester further includes a switching unit for switching over a measurement system between the AC side and the DC side in response to the determination signals.

In the above digital tester, preferably, the AC/DC determining unit compares the level of the input signal with the DC determination range at least twice at a predetermined time interval, judges the input signal to be AC when the level of the input signal has exceeded the DC determination range on both the positive and negative sides in each of the comparison periods, and then issues the determination signals.

Preferably, the switching unit holds the measurement system set to either one of the AC side (the side of a rectifying/smoothing circuit) or the DC side (the side of an input path) in a normal state, and the AC/DC determining unit issues, as the determination signal, a switching command signal for switching over the measurement system from one normal side to the other side when that input signal, which requires the measurement system to be set to the other side, is applied. In this case, the switching unit preferably sets the measurement system to the DC side as one side in a normal state and switches over the measurement system to the AC side as the other side when appropriate.

In the case that a high-resolution A/D converter of the double integral type is used as the A/D converter for converting the input signal into digital form and outputting it as the measurement signal in a state that the measurement system is set to the AC or DC side corresponding to the input signal, a reset signal generator is preferably provided for outputting a reset signal to the high-resolution A/D converter when the input signal is changed over between AC and DC.

To solve the above second problem, a digital tester according to the present invention includes a potential zone determining unit for determining to which one of a plurality of potential zones (potential zones A, B and C) an input potential VIN belongs. The potential zones are defined by at least two reference potentials, e.g., +1V and −1V. The potential zone determining unit outputs a result of the determination as potential zone signals Sa. A start signal generator is included, and detects, based on the potential zone signals Sa output from the potential zone determining unit, that the input potential VIN has exceeded any one of the reference potentials and whether VIN has changed from one to another different potential zone. The start signal generator outputs a start signal S1 for instructing the start of pulse width measurement. A stop signal generator is also included, and detects, based on the potential zone signals Sa output from the potential zone determining unit, that after output of the start signal S1 from the start signal generator unit, the input potential VIN has changed over in the potential zone again by exceeding at least the reference potential which was exceeded for the first time, i.e., at the time of the start signal S1 being output. The stop signal generator outputs a stop signal S2 for instructing the end of the pulse width measurement. A time counting unit counts a time period from the output of the start signal S1 to the output of the stop signal S2.

Preferably, the above digital tester further comprises a forced stop command signal generator for outputting, upon being operated externally, a forced stop command signal St for commanding the stop signal generator to forcibly output the stop signal S2.

To solve the above third problem, which is present in digital testers having a digital tester body and probes having measuring terminals on one end and test leads connected to the other end for electrical conduction of the measuring terminals to said digital tester body, according to the invention, the digital tester body is provided in its side surfaces with a probe storing groove that is able to store the probes, and a slip-off preventive mechanism for engaging outer peripheral surfaces of the probes stored in the probe storing groove to prevent slip-off of the probes from the probe storing groove. In this digital tester, the slip-off preventive mechanism can be provided by utilizing, for example, elastically contacting engagement portions formed to inwardly project from opposite side walls defining the probe storing groove therebetween for coming into elastic contact with the outer peripheral surfaces of the probes in the probe storing groove.

In the present invention, preferably, the digital tester body is formed in each of its side surfaces with the probe storing groove or a test lead storing groove that is continuous with the probe storing groove for storing the test leads, so that the digital tester body can store the probes in the probe storing groove after the test leads are wrapped over the body side surfaces to be stored in the test lead storing groove and the probe storing groove.

Preferably, in those portions of the opposite side walls defining the probe storing groove therebetween, where the measuring terminals of the probes stored in the probe storing groove are positioned, there are formed measuring terminal exposure recesses extending inwardly from open wall edges. Measuring terminals of the probes stored in the probe storing groove extend through these exposure recesses so that they are exposed to the exterior of the digital tester. The term "recess" as used in the specification is meant to refer to a shape having outer contours located inside the outermost contour; thus, recess is not always limited to a largely recessed shape.

Also preferably, in those portions of the opposite side walls defining the probe storing groove therebetween, where the grips of the probes stored in the probe storing groove are positioned, there are formed probe take-out recesses extending inwardly from open wall edges. The grips of the probes stored in the probe storing groove are exposed through these probe take-out recesses.

In the present invention, preferably a measurement mode select rotary switch provided on an upper surface of the digital tester body may have small bosses formed on the switch surface for improving grip and thereby preventing finger slips. In this case, preferably, the small bosses are formed in the circumferential direction near an outer peripheral edge of the measurement mode select rotary switch with a predetermined pitch. The predetermined pitch of the small bosses is different from a pitch at which the measurement mode select marks are formed around and outwardly of a circumference of the measurement mode select rotary switch.

Further preferably, on the upper surface of the digital tester body, there may be formed an upper recess extending from one side of an area in which the measurement mode select rotary switch is formed, to an upper side edge of the digital tester body.

In the digital tester according to the present invention, when a signal is input to the digital tester, the high-speed A/D converter first converts the input signal into digital form and outputs it as an AC/DC determination signal. Based on this AC/DC determination signal, the AC/DC determining unit then determines whether a level of the input signal exceeds the DC determination range defined by positive and negative thresholds on both the positive and negative sides for a predetermined time period. In this process, the AC/DC determining unit judges the input signal to be AC when the level of the input signal has exceeded the DC determination range on both the positive and negative sides for the predetermined time period, and outputs the appropriate determination signal. In response to the determination signal, the switching unit switches over the measurement system between the AC side and the DC side. Thus, the input signal is determined to be AC when its level has exceeded the DC determination range on both the positive and negative sides for the predetermined time period, and to be DC when its level has not exceeded the DC determination range or has exceeded the DC determination range on either the positive or negative side only, followed by switching over the measurement system by the switching unit. With the digital tester according to the present invention, therefore, the measurement system is automatically switched over corresponding to the input signal, enabling the measurement to be performed under conditions corresponding to the input signal with no need that the user have knowledge about whether the input signal is AC or DC. While an A/D converter for converting the input signal into digital form for output of a measurement signal is required to have a high resolution, a high-speed A/D converter is employed as the A/D converter for outputting the AC/DC determination signal in pursuit of a high operation speed only, leaving resolution out of account. This speeds up change-over of the measurement system between the AC side and the DC side, with the result of a high response for the input signal.

On the other hand, when a signal is input to the digital tester according to the present invention in a pulse width measuring mode, the potential zone determining unit first determines to which one of the potential zones (the potential zones A, B and C) the input potential VIN belongs, and then outputs a result of the determination as the potential zone signals Sa. When the input potential VIN is changed but remains in the same potential zone without exceeding any reference potentials, the potential zone signals Sa output from the potential zone determining unit remain unchanged and, therefore, the start signal generator does not output the start signal S1. When the input potential VIN has exceeded the reference potential and changed over from one to another potential zone, the potential zone signals Sa output from the potential zone determining unit are changed. Upon detecting such change-over in the potential zone, the start signal generator outputs the start signal S1 for instructing the start of the pulse width measurement. Subsequently, when the input potential VIN has changed over in the potential zone again by exceeding the reference potential that was exceeded for the first time, the potential zone signals Sa output from the potential zone determining means are changed. Upon detecting such change-over in the potential zone, the stop signal generator outputs the stop signal S2 for instructing the stop of the pulse width measurement. Then, the time counting unit counts, as a pulse width, the period from output of the start signal S1 to output of the stop signal S2.

In the digital tester according to the present invention, the test leads are connected to the digital tester body for electrical conduction between the digital tester body and the measuring terminals. Under this condition, a value of the voltage, etc. developed between the measuring terminals is measured based on information input through the measuring terminals. Also, in the digital tester according to the present invention, when the probes are stored in the probe storing groove formed in the side surfaces of the digital tester body, the probes are prevented from slipping off from the probe storing groove because of the slip-off preventive mechanism provided in the probe storing groove by utilization of the elastically contacting engagement portions. This enables the digital tester to be carried with the probes kept in such a stored state. Accordingly, the probes are no longer required to be stored in a box case or the like each time the digital tester is carried with the user. Additionally, the digital tester can be used immediately after removing the probes out of the probe storing groove, thereby making the digital tester more handy to use.

BRIEF DESCRIPTION OF THE DRAWINGS

The invention will be described in detail with reference to the following drawings in which like reference numerals refer to like elements.

FIG. 3(a) is a rear view thereof.

DETAILED DESCRIPTION OF PREFERRED EMBODIMENT

One embodiment of the present invention will be hereinafter described with reference to the attached drawings.

A digital tester 1 of this embodiment includes, inside its body 10, a measurement circuit such as a resistance measuring circuit provided with buffer amplifiers and selectors for selecting a reference potential and a reference resistance suitable for resistance measurement depending on each of plural measurement modes. The measurement circuit corresponds to some of the functions incorporated in NJU 9210 made by New Japan Radio Co., Ltd. The body 10 of digital tester 1 also holds an AC/DC determining and switching unit for automatically determining whether an input signal is AC or DC, and automatically switching over a measurement system between the AC side and the DC side. After the switch-over of the measurement system by the AC/DC determining and switching unit, a voltage value of the input signal or the like is measured.

Figure 4:
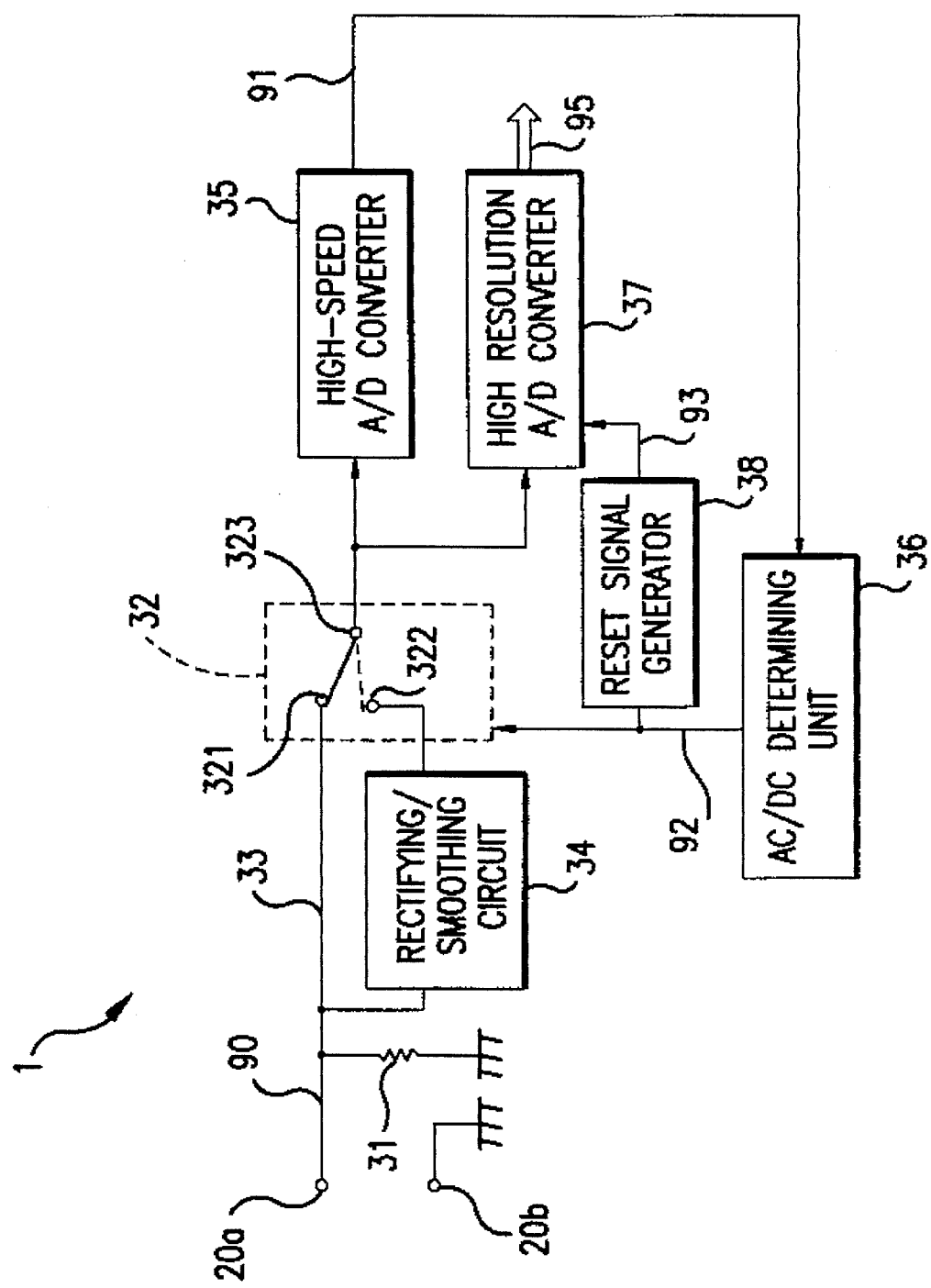
FIG. 4 is a block diagram showing the inner configuration of the digital tester of FIG. 1.

More specifically, the digital tester 1 of this embodiment comprises, as shown in a block diagram of FIG. 4, a pair of probes 20a, 20b, a pull-down resistor 31 connected to the positive probe 20a, a switching unit 32 connected downstream of the pull-down resistor 31, and a rectifying/smoothing circuit 34 connected in parallel to an input path 33 leading from the pull-down resistor 31 to the switching unit 32. The rectifying/smoothing circuit 34 has a rectifying circuit for full-wave rectifying an AC when it is applied, and a smoothing circuit for smoothing the rectified current, and serves as an input stage (measurement system) in the case of an input signal 90 being AC. On the other hand, the input path 33 serves as an input stage (measurement system) in the case of the input signal 90 being DC. The switching unit 32 is schematically shown as a switch 323 capable of selectively contacting a DC terminal 321 connected to the input path 33 and an AC terminal 322 connected to the rectifying/smoothing circuit 34. In the switching unit 32, the switch 323 is kept turned for connection to the DC terminal 321, as indicated by a solid line, in a normal state where no signals are applied. Downstream of the switching unit 32, there is connected a high-resolution A/D converter 37 for converting the input signal 90 into digital form and outputting it as a measurement signal 95 to a measurement unit (not shown). The high-resolution A/D converter 37 is of a double-integral type A/D converter with high resolution covering 3200 counts, and is used for measurement of the input signal 90.

The digital tester 1 of this embodiment also includes a high-speed A/D converter 35 downstream of the switching unit 32. The high-speed A/D converter 35 is of a sequential comparison type A/D converter which has a lower resolution, covering 64 counts, than the high-resolution A/D converter 37, but can operate at a high speed. The high-speed A/D converter 35 converts the input signal 90 into digital form at a high speed and outputs it as an AC/DC determination signal 91 to an AC/DC determining unit 36. The AC/DC determining unit 36 comprises a microcomputer and operates, based on operation programs stored therein, to determine whether the input signal 90 is AC or DC, from the AC/DC determination signal 91 output from the high-speed A/D converter 35, and to control the switching unit 32 in response to a result of the determination. More specifically, when the input signal 90 is determined to be DC, the AC/DC determining unit 36 outputs a determination signal 92 for holding the switch 323 connected to the DC terminal 321 (i.e., in the state indicated by the solid line). On the other hand, when the input signal 90 is determined to be AC, the AC/DC determining unit 36 outputs a switching command signal (another determination signal 92) for turning the switch 323 to be connected to the AC terminal 322 (i.e., into a state indicated by a broken line). In practice, the AC/DC determining unit 36 determines the input signal 90 to be AC when it is judged that a level of the input signal 90 has exceeded a DC determination range (+3 V to −3 V), defined by a threshold of 3 V (+3 V, −3 V), on both the positive and negative sides for a predetermined comparison period, and to be DC, even though it is actually AC, when the input signal 90 has not exceeded even only one of threshold voltages of +3 V and −3 V. The AC/DC determining unit 36 compares a level of the input signal 90 with the DC determination range (+3 V to −3 V) twice during a predetermined time interval and determines the input signal 90 to be AC when the level of the input signal 90 has exceeded the DC determination range (+3 V to −3 V) on both the positive and negative sides in each of the two comparison periods.

The digital tester 1 of this embodiment further includes a reset signal generator 38 for outputting a reset signal 93 to the high-resolution A/D converter 37 when the input signal is changed over between AC and DC. In response to the reset signal 93 output from the reset signal generator 38, the high-resolution A/D converter 37 stops its processing operation and then returns to an initial state for starting processing of the new input signal 90 as soon as possible.

The above-described digital tester can be realized by adding to a digital tester IC having functions incorporated in NJU 9210 made by New Japan Radio Co., Ltd. the following elements: a high-speed A/D converter means (i.e., the high-speed A/D converter 35) capable of operating at a high speed, switching means (i.e., the switching unit 32) for switching over a measurement system between the AC side and the DC side, AC/DC determining means (i.e., the AC/DC determining unit 36) for comparing a level of the input signal with a DC determination range defined by positive and negative thresholds based on the AC/DC determination signal 91, and for judging the input signal to be AC when the level of the input signal has exceeded the DC determination range on both the positive and negative sides for a predetermined comparison period, and for issuing the determination signals 92 corresponding to AC and DC.

Figures 9A, 9B:
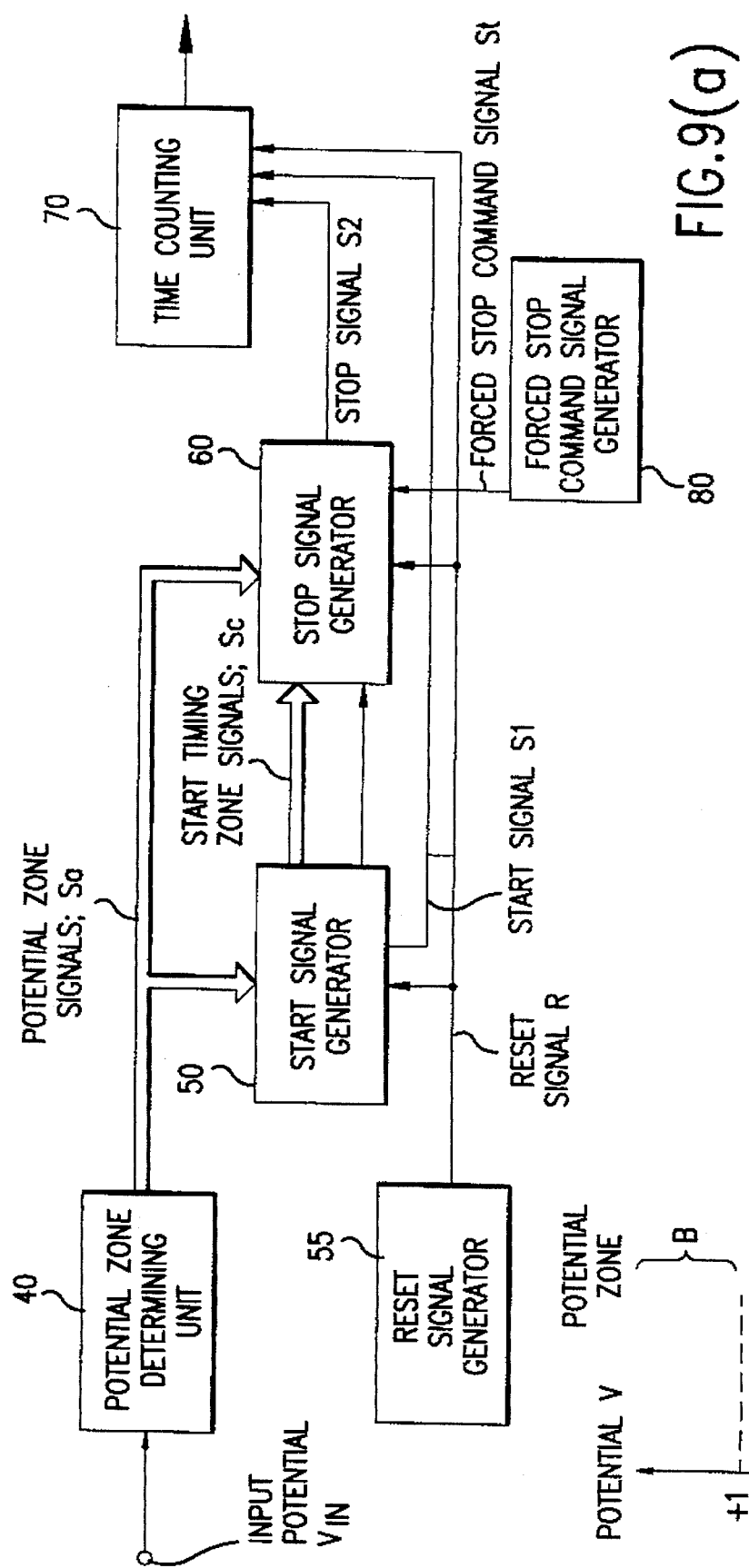
FIG. 9(a) is a block diagram showing the inner configuration of the digital tester of FIG. 1.
FIG. 9(b) is an explanatory view showing potential zones relating to a basic operation of the digital tester.

The digital tester 1 of this embodiment also includes a pulse width measuring circuit for measuring a pulse width of the input signal inside its body 10, in addition to a measurement circuit such as a resistance measuring circuit provided with buffer amplifiers and selectors for selecting a reference potential and a reference resistance suitable for resistance measurement depending on each of measurement modes, the circuit corresponding to some of the functions incorporated in NJU 9210 made by New Japan Radio Co., Ltd. The pulse width measuring circuit is operated by depressing a mode subselect button 12a under a condition that a measurement mode select rotary switch 13 is set to a mark 14c for selecting frequency measurement. The pulse width measuring circuit is arranged, as schematically shown in a block diagram of FIG. 9(a) and an explanatory view of FIG. 9(b) for explaining the operation principles, such that a potential zone determining unit 40 is provided for determining to which one of potential zones A, B, C an input potential VIN belongs. These potential zones are defined by two reference potentials of +1 V and −1 V. Unit 40 outputs a result of the determination as potential zone signals Sa, and a pulse width is measured based on the potential zone signals Sa output from the potential zone determining unit 40. More specifically, the digital tester 1 of this embodiment comprises, downstream of the potential zone determining unit 40, a start signal generator 50 for detecting that the input potential VIN has exceeded one of the reference potentials and changed from one to another potential zone, and for outputting a start signal S1 for instructing the start of the pulse width measurement. Also downstream of the start signal generator 50, a stop signal generator 60 for detecting, based on the potential zone signals Sa output from the potential zone determining unit 40, that after output of the start signal S1 from the start signal generator 50, the input potential VIN has changed over in the potential zone again by exceeding that reference potential that was exceeded for the first time, and for outputting a stop signal S2 for instructing the end of the pulse width measurement. Additionally, in a time counting unit 70, the number of clock signals generated during the time from output of the start signal S1 to output of the stop signal S2 is counted by a counter 71 for measuring a pulse width.

The circuit configurations and functions of the potential zone determining unit 40, the start signal generator 50, the stop signal generator 60, etc. will be described below in detail with reference to FIGS. 10 and 11.

Figure 10:
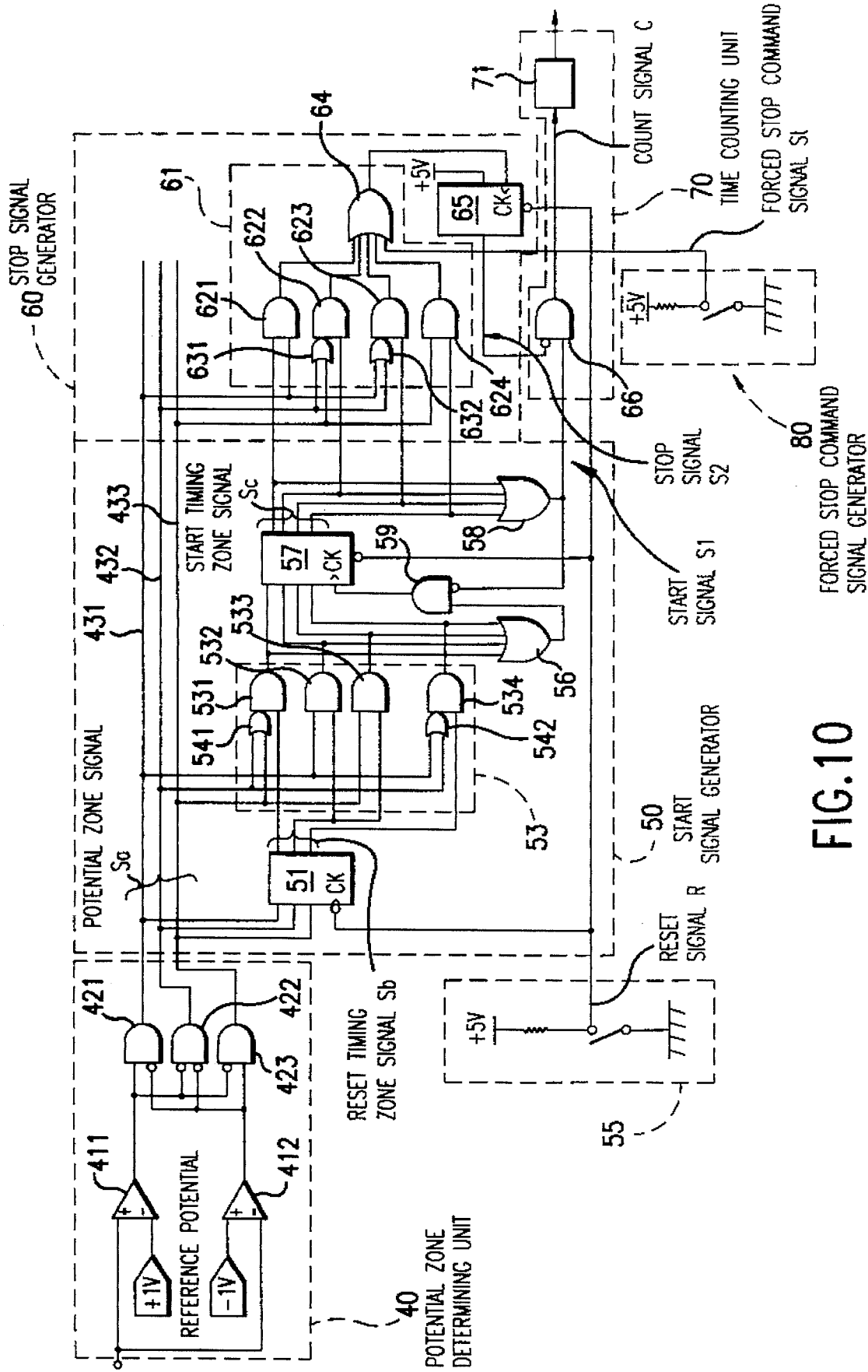
FIG. 10 is a circuit block diagram showing the configuration of a pulse width measuring circuit in the digital tester of FIG. 1.
Figure 11:
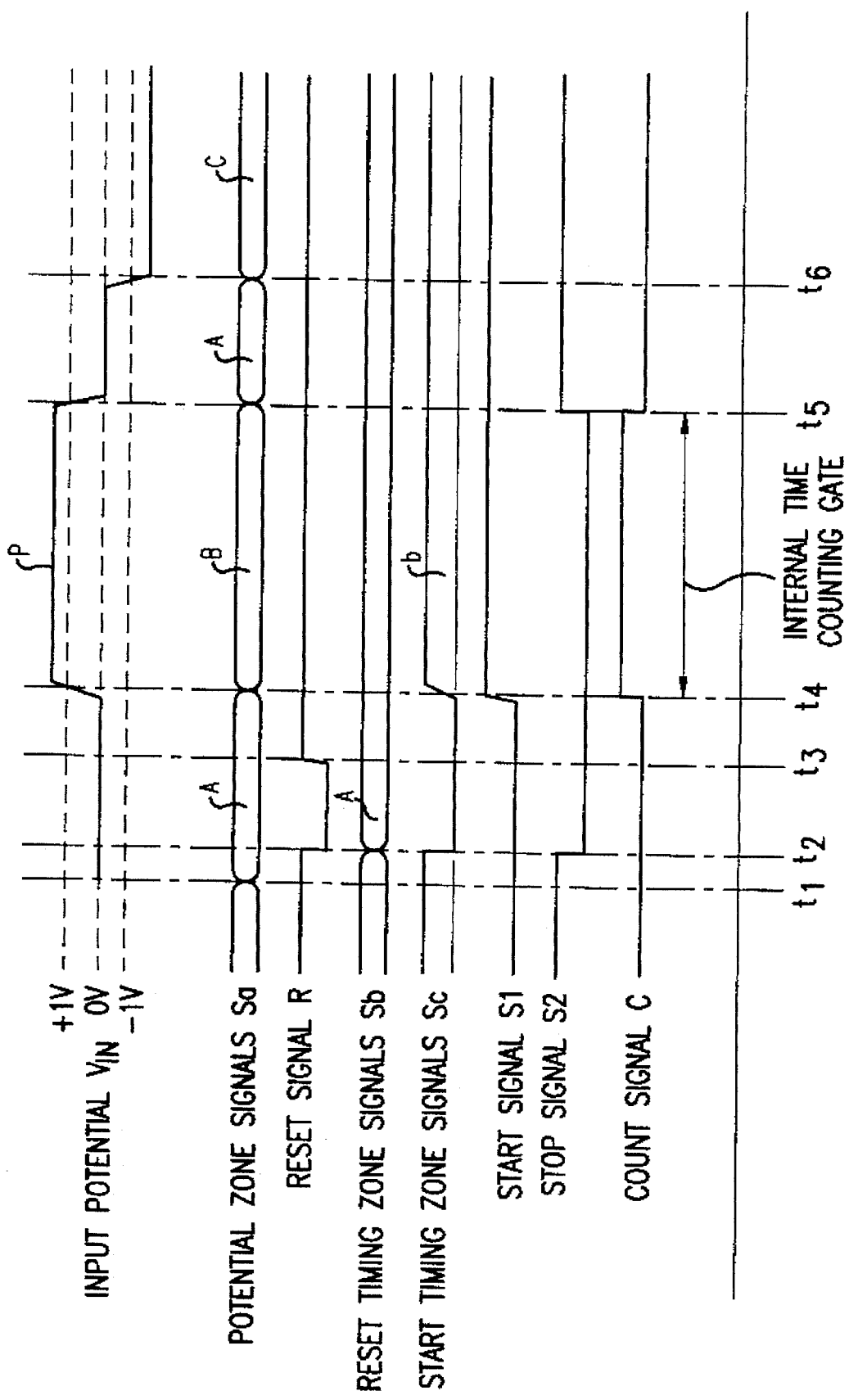
FIG. 11 is a timing chart for explaining a pulse width measuring operation in the digital tester of FIG. 1.

FIG. 10 is a circuit block diagram showing the configuration of the pulse width measuring circuit incorporated in the digital tester of this embodiment, and FIG. 11 is a timing chart showing waveforms of respective signals input to and output from the pulse width measuring circuit.

Referring to these figures, the potential zone determining unit 40 has a first comparator 411 for comparing the input potential VIN with +1 V as a first reference potential and outputting a signal "H" when the input potential VIN is a positive potential larger than +1 V, and a second comparator 412 for comparing the input potential VIN with −1 V as a second reference potential and outputting a signal "H" when the input potential VIN is a negative potential larger than −1 V. An output of the first comparator 411 is applied, along with an output of the second comparator 412 after being inverted, to an AND circuit 421, which outputs a signal "H" over a signal line 431 when the input potential VIN is a positive potential larger than +1 V (i.e., belongs to the potential zone B). Also, the output of the first comparator 411 and the output of the second comparator 412 are both applied to a NOR circuit 422, which outputs a signal "H" over a signal line 432 when the input potential VIN is in the range of 1 V to −1 V (i.e., in the potential zone A). Further, the output of the second comparator 412 is applied, along with the output of the first comparator 411 after being inverted, to an AND circuit 423 which outputs a signal "H" over a signal line 433 when the input potential VIN is a negative potential larger than −1 V (i.e., belongs to the potential zone C). Accordingly, to which of the potential zones A, B, C the input potential VIN belongs at the present can be recognized by knowing over which of the signal lines 431 to 433 the signal "H" is output from the zone potential determining unit 40. Thus, the signals output over the signal lines 431 to 433 become the aforesaid potential zone signals Sa.

The start signal generator 50 comprises a D latch circuit 51 to which the signals transmitted over the signal lines 431 to 433 are applied, and a start timing detecting unit 53 for detecting rise or fall of the input potential VIN based on both the signals (reset timing zone signals Sb) of which data are held by the D latch circuit 51 and the potential zone signals Sa applied over the signal lines 431 to 433. The start timing detecting unit 53 is constituted by two OR circuits 541, 542 and four AND circuits 531, 532, 533, 534, while a pull-up type reset signal generator 55 is connected to a CK terminal of the D latch circuit 51. Therefore, when a reset signal R applied from the reset signal generator 55 to the CK terminal of the D latch circuit 51 is changed from "H" to "L" upon the generator 55 being operated externally, the signals over the signal lines 431 to 433 are latched as the reset timing zone signals Sb by the D latch circuit 51 for holding the data. Then, based on both the reset timing zone signals Sb and the current potential zone signals Sa directly applied to the start timing detecting unit 53 over the signal lines 431 to 433, it is determined whether the potential zone of the input potential VIN has changed. When the potential zone of the input potential VIN has changed, a signal "H" is output from any one of the AND circuits 531 to 534.

The start signal generator 50 further comprises, downstream of the start timing detecting unit 53, an OR circuit 56, a D latch circuit 57, an OR circuit 58 and an AND circuit 59. The signals output from the start timing detecting unit 53 are applied through the D latch circuit 57 to the OR circuit 58 of which output is applied to the AND circuit 59 after being inverted, and the signals output from the start timing detecting unit 53 are also applied to the AND circuit 59 through the OR circuit 56. A signal output from the AND circuit 59 is input to a CK terminal of the D latch circuit 57. Also, the reset signal R from the reset signal generator 55 is input to a reset terminal of the D latch circuit 57 so that, upon the reset signal R changing from "H" to "L", the D latch circuit 57 is reset and the side downstream of the OR circuit 58 is turned to an "L" state. Thereafter, when a signal "H" is output from any one of the AND circuits 531 to 534 in the start timing detecting circuit 53, the signal input to the CK terminal of the D latch circuit 57 is changed from "L" to "H" and the signal "H" from the start timing detecting unit 53 is latched as one of start timing zone signals Sc by the D latch circuit 57 for holding the data. Therefore, the start signal S1 output to the time counting unit 70 downstream of the OR circuit 58 is raised from "L" to "H" and this rise of the start signal S1 serves as a substantial start signal to define the start timing for the pulse width measurement in the time counting unit 70. Specifically, when the start signal output from the OR circuit 58 is changed from "L" to "H" a signal output from the stop signal generator 60 is "L" and applied to an AND circuit 66 in the time counting unit 70 after being inverted, as described later. As a result, a count signal C output from the AND circuit 66 to the counter 71 turns to "H" whereupon a time counting gate inside the counter 71 also turns to "H" to start counting of clock signals.

The stop signal generator 60 comprises a stop timing detecting unit 61 to which the signals output from the D latch circuit 57 and transmitted over the signal lines 431 to 433 are applied. The stop timing detecting unit 61 includes two OR circuits 631, 632 and four AND circuits 621, 622, 623, 624. In the stop timing detecting unit 61, when the signals applied from the D latch circuit 57 are all "L" a signal "L" is output to an OR circuit 64. Even with any one of the signals (i.e., the start timing zone signals Sc) output from the D latch circuit 57 being "H" so long as there is no change between the potential zone of the input potential VIN at start of the pulse width measurement indicated by the start timing zone signals Sc and the potential zone of the input potential VIN indicated by the current potential zone signals Sa input over the signal lines 431 to 433, a signal "L" continues being output to the OR circuit 64. On the other hand, when there occurs a change between the potential zone of the input potential VIN indicated by the start timing zone signals Sc and the potential zone of the input potential VIN indicated by the potential zone signals Sa, and also the input potential VIN has changed over in potential zone again by exceeding at least that reference potential which has been exceeded for the first time, a signal "H" is output to the OR circuit 64. Therefore, a signal applied from the OR circuit 64 to a CK terminal of a D latch circuit 65 turns from "L" to "H", whereupon a signal "H" given from a power supply with a potential of 5 V is input as the stop signal S2 to the time counting unit 70.

In the time counting unit 70, when the signal output from the D latch circuit 65 turns from "L" to "H", this signal "H" is applied to the AND circuit 66 after being inverted, thereby changing the output of the AND circuit 66 to "L". Accordingly, the count signal C output from the AND circuit 66 turns to "L" to stop counting of clock signals by the counter 71, so that the period determined from the number of clock signals counted so far during the measurement time is indicated as a pulse width in a display 11 of the digital tester 1.

In addition, the digital tester 1 of this embodiment further includes a pull-up type forced stop command signal generator 80 associated with the OR circuit 64 in the stop signal generator 60. When a forced stop command signal St of "H" is output from the forced stop command signal generator 80 to the OR circuit 64 upon the generator 80 being operated externally, a signal "H" is input to the D latch circuit 65. Therefore, the D latch circuit 65 outputs the stop signal of "H" and the output of the AND circuit 66 turns to "L", whereby the counting of clock signals in the time counting unit 70 is forcibly stopped.

AC/DC DETERMINATION

In the digital tester 1 constructed as explained above, test leads 22a, 22b are connected to the digital tester body 10 for electrical conduction between the body 10 and measuring terminals 21a, 21b. Under this condition, the measuring terminals 21a, 21b are brought into electrical contact with parts of an electric circuit or the like for measuring a value of the voltage, etc. developed between the measuring terminals 21a and 21b.

Figure 5:
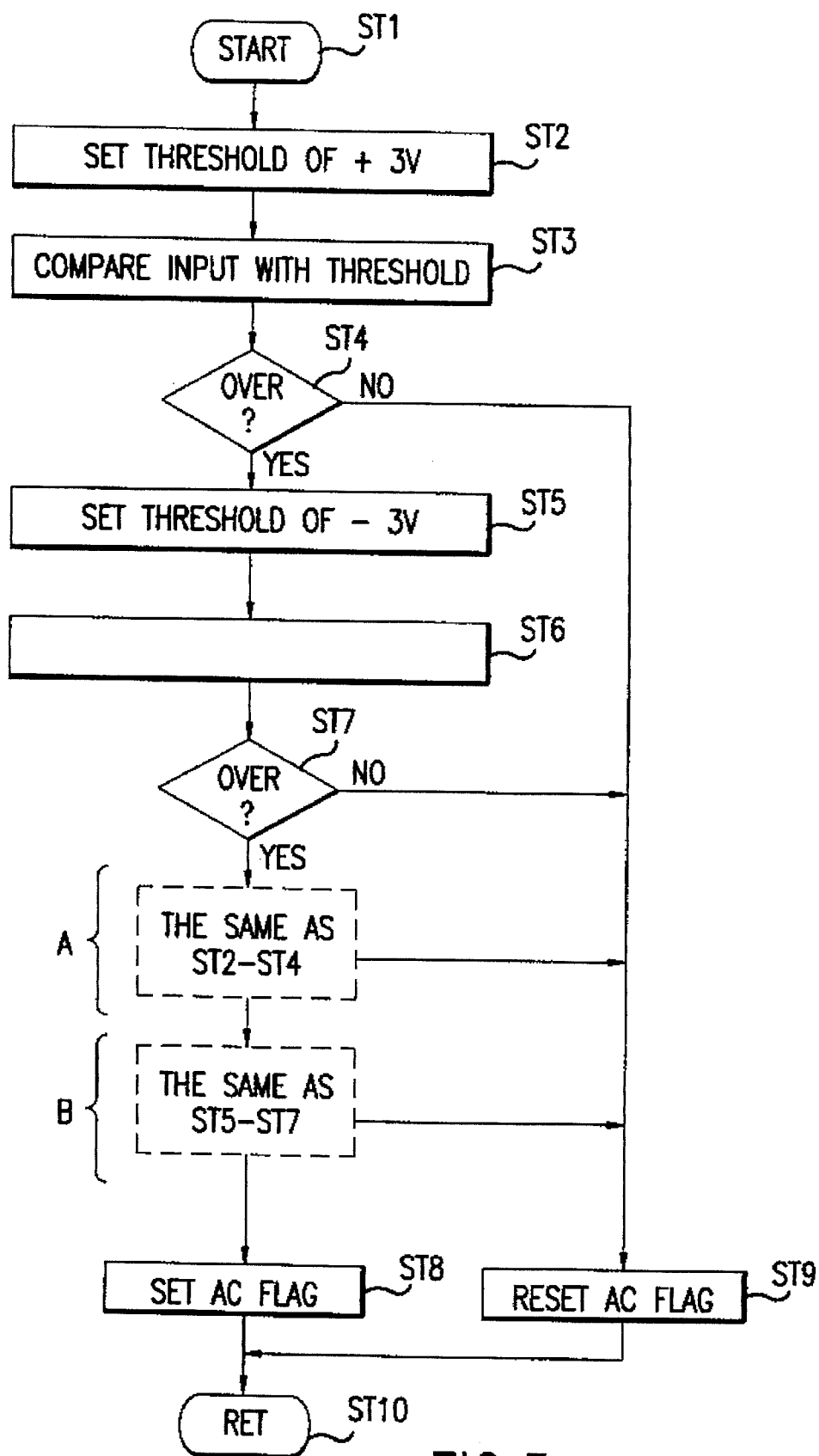
FIG. 5 is a flowchart showing an AC/DC determining operation in the digital tester of FIG. 1.
Figure 6:
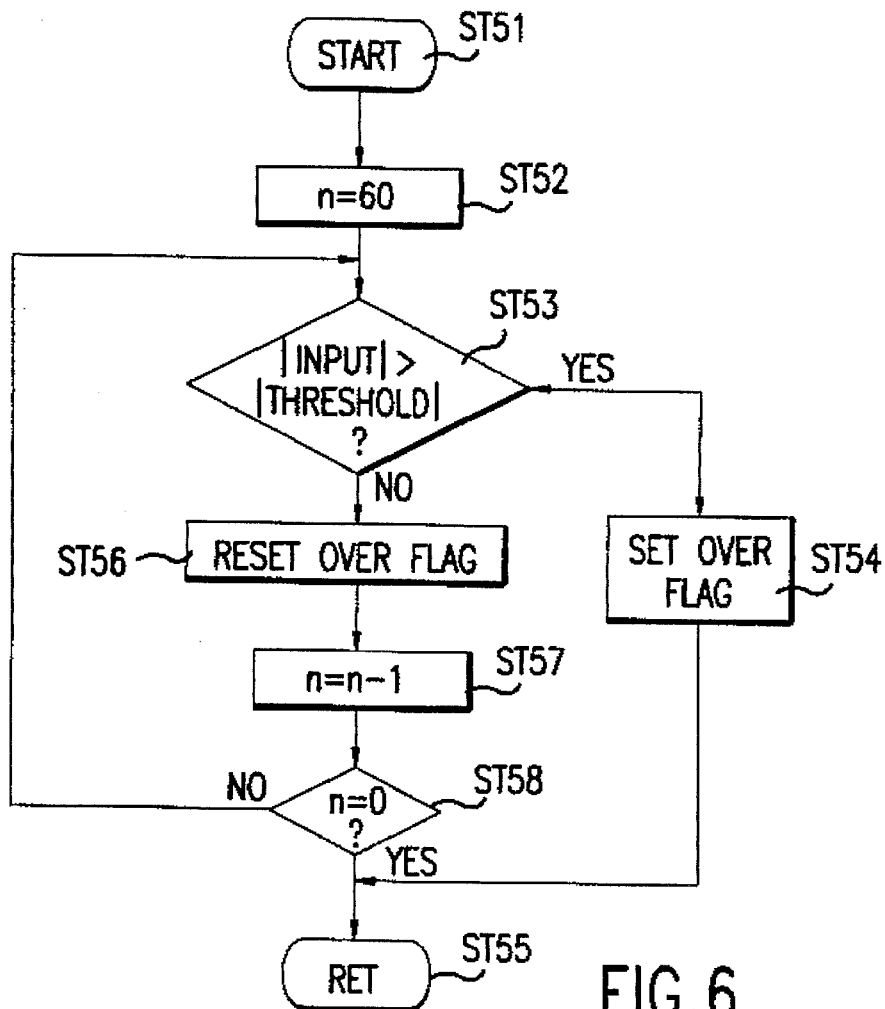
FIG. 6 is a flowchart showing an operation of comparing an input signal and thresholds in the digital tester of FIG. 1.

Because measurement of resistance, etc. is performed in a well-known manner, the following description will be given of only operations of the switching unit 32, the high-speed A/D converter 35, the AC/DC determining unit 36 and so on, which jointly carry out the AC/DC determining and switching function as one feature of the digital tester 1 of this embodiment, with reference to FIGS. 5 and 6. The AC/DC determining and switching operation in the digital tester 1 is performed in accordance with programs stored in a microcomputer, which can constitute the AC/DC determining unit 36 and so on. Therefore, the AC/DC determining and switching operation will be explained by referring to the flowchart of FIG. 5 showing the AC/DC determining and switching operation in the digital tester 1 and the flowchart of FIG. 6 showing a subroutine for an operation of comparing the input signal 90 and the thresholds.

Before the input signal 90 is applied, i.e., in a normal state, the switch 323 in the switching unit 32 is maintained in connection with the DC terminal 321.

First, when the input signal 90 is, in step ST1, applied to the digital tester 1 through the measuring terminal 21a of the probe 20a, +3 V is set, in step ST2, in the AC/DC determining unit 36 as one threshold for determining whether the input signal 90 is AC or DC.

Next in step ST3, the input signal 90 is compared with the threshold (+3 V) based on the AC/DC determination signal 91. To describe this step in more detail, after the processing is started in step ST51 of the flowchart shown in FIG. 6, 60 is set as a number-of-repetitions index (n) in step ST52.

Figure 7:
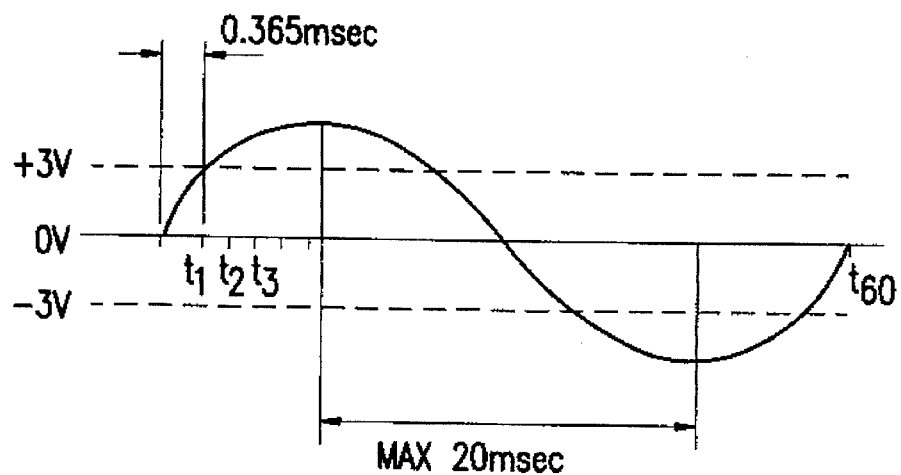
FIG. 7 is a chart showing a waveform of the input signal for explaining the operation of comparing the input signal and the thresholds shown in FIG. 6.

Thereafter, step ST53 makes a comparison between an absolute value of the input voltage (the input signal 90) and an absolute value of +3 V set as the threshold, i.e., between the input voltage at time t1 in a waveform of FIG. 7, and +3 V set as the threshold. If the input voltage is judged to be higher than +3 V, for example, at time t3, then an OVER flag indicating that judgment is set in step ST54, followed by returning to the main routine (in step ST55). On the other hand, if the input voltage is judged to be lower than +3 V, for example, at time t1, then the OVER flag is reset in step ST56. Following that, the number-of-repetitions index is decremented by one from 60 to 59 in step ST57.

Next, in step ST58, it is determined whether the number-of-repetitions index is zero. Since the number-of-repetitions index is not equal to zero, the processing returns to step ST53 upon judgment that the comparison period has not yet ended.

The above process (step ST53 to step ST58) is repeated at an interval of, for example, 0.366 msec until the number-of-repetitions index becomes zero, while successively comparing the input voltage at each of time t1, t2, t3 . . . t60 in the waveform of FIG. 7 with +3 V set as the threshold. When the input voltage is judged to be higher than +3 V during about 200 msec (i.e., the comparison period) in which the above process is repeated for 60 cycles, the OVER flag indicating that judgment result is set in step ST54, followed by returning to step ST4 in the flowchart of FIG. 5 (in step ST55). Accordingly, the input signal 90 having a ½ period longer than 20 msec, i.e., the input signal 90 having a frequency less than 25 Hz, is not judged to be AC. On the contrary, when the input voltage is not judged to be higher than +3 V during the comparison period and the number-of-repetitions index is judged to be zero in step ST58, the processing is returned to step ST4 in the flowchart of FIG. 5 (in step ST55) while keeping the OVER flag reset.

In step ST4, it is determined whether the OVER flag is set. If the OVER flag is set, then the processing goes to step ST5 and so on, whereas if the OVER flag is not set, then the processing goes to step ST9 where an AC flag (i.e., the determination signal 92) is reset upon judgment that the input signal is DC.

When the OVER flag is set, it is determined through the processing subsequent to step ST5 whether the input voltage is lower than −3 V. This is done because the input voltage may be a DC voltage higher than +3 V and, if the input voltage is AC, a voltage lower than −3 V (i.e., a negative voltage having an absolute value larger than 3 V) has to be also input.

Therefore, after −3 V is set as another threshold in step ST5, the input voltage (i.e., the input signal 90) is compared with −3 V as the threshold in step ST6. As with step ST3, this comparison is also performed through the processing from step ST51 to step ST58 in the flowchart of FIG. 6. More specifically, after 60 is set as the number-of-repetitions index (n) in step ST52, an absolute value of 3 V set as the threshold and an absolute value of the input voltage are compared with each other in step ST53. If the input voltage is judged to be lower than −3 V, then an OVER flag indicating that judgment result is set in step ST54, followed by returning to the main routine (in step ST55). On the other hand, if an input voltage lower than −3 V is not applied during the measurement period in which the comparison between −3 V, set as the threshold, and the input voltage is repeated 60 times, then the processing is returned to step ST7 in the flowchart of FIG. 5 (in step ST55) while keeping the OVER flag reset.

In step ST7, it is determined again whether the OVER flag is set. If the OVER flag is set, then the processing proceeds to execute a process A, whereas if the OVER flag is not set, then the processing goes to step ST9 where the AC flag is reset upon judgment that the input signal is DC.

In the process A, the processing similar to that from step ST2 to step ST4 is repeated. Thereafter, if the OVER flag is set, then the processing proceeds to execute a process B, whereas if the OVER flag is not set, then the processing proceeds to step ST9 where the AC flag is reset upon judgment that the input signal is DC. In the process B, the processing similar to that from step ST5 to step ST7 is repeated. Thus, if the OVER flag is set, then the AC flag is set in step STS, whereas if the OVER flag is not set, then the processing goes to step ST9 where the AC flag is reset upon judgment that the input signal is DC.

Figure 8A:
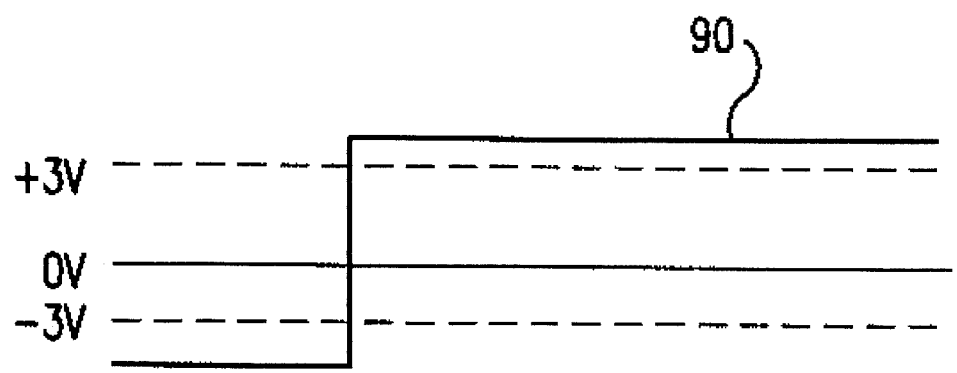
FIGS. 8(a) and 8(b) are each a chart showing a waveform of the input signal, for explaining the AC/DC determining operation shown in FIG. 5.
Figure 8B:
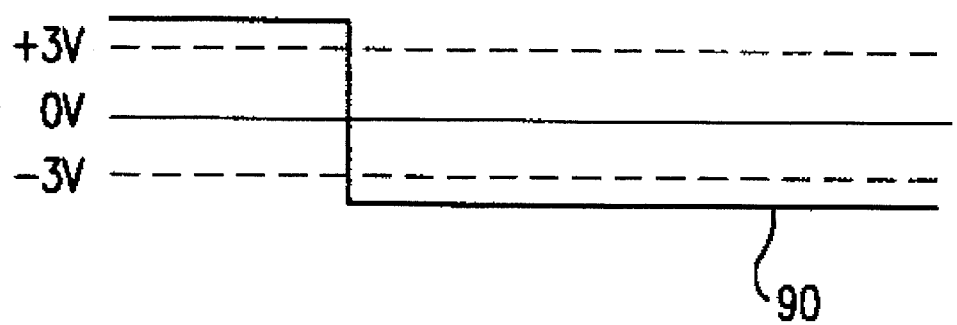

The reason why the processing from step ST2 to step ST4 and the processing from step ST5 to step ST7 are each repeated twice (as the process A and the process B, respectively) is as follows. When a voltage lower than −3 V is first applied and a DC voltage higher than +3 V is then applied, as shown in FIG. 8(a), the input signal 90 may be mistaken as AC, even though it is actually DC, judging from a result of the determination made only at such a transition. Likewise, when a voltage higher than 3 V is first applied and a DC voltage lower than −3 V is then applied, as shown in FIG. 8(b), the input signal 90 may also be mistaken as AC, even though it is actually DC, judging from a result of the determination made only at such a transition.

In the case that the AC flag is reset as the result of the AC/DC determining operation carried out in the AC/DC determining unit 36 through the above-explained processing, the AC/DC determining unit 36 does not output the switching command signal (i.e., the determination signal 92) to the switching unit 32, and the switching unit 32 holds the switch 323 connected to the DC terminal 321 so that the input signal 90 is transmitted to the downstream stage through the input path 33. Subsequently, the input signal 90 is converted into digital form by the high-resolution A/D converter 37 and output as the measurement signal 95 to the measurement system.

Meanwhile, in the case that the AC flag is set, the AC/DC determining unit 36 outputs the switching command signal (i.e., the determination signal 92) to the switching unit 32 and, in response to the switching command signal, the switching unit 32 turns the switch 323 from a (normal) state of being connected to the DC terminal 321 into a state of being connected to the AC terminal 322, so that the input signal 90 is full-wave rectified and smoothed by the rectifying/smoothing circuit 34 and then output as the measurement signal 95 to the measurement system after being converted into digital form by the high-resolution A/D converter 37.

The processing returns from step ST10 to step ST1 for monitoring as to whether the input signal 90 is AC or DC, during the measurement as well. Therefore, even when the input signal 90 is changed to AC from the state of measuring DC, the switching unit 32 can automatically turn the switch 323 from the DC terminal 321 to the AC terminal 322. On the other hand, if the input signal 90 is pulled down upon the positive probe 20a detaching from the part of a circuit or the like under measurement, this is regarded as input of a DC voltage and the AC flag is reset. In this case, corresponding to the reset of the AC flag in the AC/DC determining unit 36, the switching unit 32 returns the switch 323 from the state of being connected to the AC terminal 322 to the state of being connected to the DC terminal 321. Also, since the reset signal generator 38 outputs the reset signal 93 to the high-resolution A/D converter 37, the signal so far held by the high-resolution A/D converter 37 is reset to be ready for the start of processing a signal newly input, even with the high-resolution A/D converter 37 being of a double integral type A/D converter.

PULSE WIDTH MEASUREMENT

In the digital tester 1 constructed as explained above, the test leads 22a, 22b are connected to the digital tester body 10 for electrical conduction between the body 10 and the measuring terminals 21a, 21b. Under this condition, the measuring terminals 21a, 21b are brought into electrical contact with parts of an electric circuit or the like for measuring a value of the potential, etc. developed between the measuring terminals 21a and 21b. Because measurement of resistance, etc. is performed in a well-known manner, the following description will be given of only the pulse width measuring operation, as one feature of the digital tester 1 of this embodiment, with reference to FIGS. 10 and 11. Note that the digital tester 1 can be switched over to a pulse width measuring mode by depressing the mode sub-select button 12a under a condition that the measurement mode select rotary switch 13 is set to the mark 14c for selecting frequency measurement.

Now, changes in potential subjected to the pulse width measurement by the digital tester 1 are shown at the input potential VIN in FIG. 11. As indicated by the potential zone signals Sa representing the result of determining the potential zone, the input potential VIN is changed to have a potential in the range of −1 V to +1 V during a period of time t1 to time t4 (potential zone A), a positive potential larger than +1 V during a period of time t4 to time t5 (potential zone B), a potential in the range of −1 V to +1 V during a period of time t5 to time t6 (potential zone A), and a negative potential larger than −1 V during a period after time t6 (potential zone C). The following description will be given of, by way of example, the case of measuring the pulse width of a pulse P spanning from time t4 to time t5 in the input potential VIN changed as shown. Therefore, during the period of time t1 to time t2 prior to switching over the digital tester 1 to the pulse width measuring mode, a signal "H" is output over the signal line 432 from the NOR circuit 422 of the potential zone determining unit 40, whereas signals "L" are output over the signal lines 431, 433 from the AND circuits 421, 423. In other words, the potential zone signals Sa indicate that the input potential VIN belongs to the potential zone A.

Under that condition, when the measurement mode select rotary switch 13 is operated for selecting frequency measurement and the mode sub-select button 12a is depressed at time t2, the digital tester 1 is switched over to the pulse width measurement mode, whereupon the reset signal R output from the reset signal generator 55 is first turned from "H" to "L" for establishing an initial state (i.e., a reset state). Accordingly, the signals over the signal lines 431 to 433 are taken into the D latch circuit 51 and latched as the reset timing zone signals Sb therein for holding the data. Here, of the reset timing zone signals Sb applied from the D latch circuit 51 to the start timing detecting unit 53, only the signal input to the AND circuit 532 is "H" and the signals input to the other AND circuits are all "L". During the period of time t1 to time t4, however, the current potential zone signals Sa applied to the start timing detecting unit 53 over the signal lines 431 to 433 are also in a state of indicating that the input potential VIN belongs to the potential zone A. Thus, the signal applied from the signal line 431 to the AND circuit 532 is "L". Therefore, all the signals output from the AND circuits 531 to 534 remain "L". Consequently, since the signal output from the start timing detecting unit 53 to the AND circuit 59 through the OR circuit 56 is also "L", the start signal S1 output from the OR circuit 58 and the count signal C output from the OR circuit 66 both remain "L".

Under that condition, when the input potential VIN changes at time t4 from the potential zone A to the potential zone B by exceeding the reference potential of 1 V, the signal output from the AND circuit 421 over the signal line 431 turns from "L" to "H" in the potential zone determining unit 40, whereas the signal output from the NOR circuit 422 turns from "H" to "L".

Additionally, the signal output from the AND circuit 423 remains "L". In other words, the potential zone signals Sa indicate that the current input potential VIN belongs to the potential zone B. Therefore, the signal input to the AND circuit 532 over the signal line 431 turns to "H", whereupon the signal applied from the AND circuit 532 to the OR circuit 56 turns from "L" to "H". Accordingly, the signal input to the CK terminal of the D latch circuit 57 turns from "L" to "H", so that the signals from the start timing detecting unit 53 are taken into the D latch circuit 57 and latched as the start timing zone signals Sc therein for holding the data. As a result, the start signal S1 output from the OR circuit 58 to the time counting unit 70 turns from "L" to "H". So long as the potential zone of the input potential VIN represented by the start timing zone signals Sc is kept in match with the potential zone of the input potential VIN represented by the current potential zone signals Sa in the stop signal generator 60, the OR circuit 64 continues outputting a signal "L" and, therefore, the stop signal S2 output from the D latch circuit 65 remains "L" at that time. Then, at time t4 when the start signal S1 output from the OR circuit 58 to the time counting unit 70 turns from "L" to "H", the count signal C output from the AND circuit 66 also turns from "L" to "H" thereby starting the counting of clock signals in the time counting unit 70.

Under that condition, when the input potential VIN changes at time t5 from the potential zone B to the potential zone A by exceeding the reference potential of 1 V (i.e., the reference voltage that has been exceeded for the first time), the signal output from the NOR circuit 422 over the signal line 432 turns from "L" to "H", whereas the signal output from the AND circuit 421 turns from "H" to "L". Additionally, the signal output from the AND circuit 423 remains "L". In other words, the potential zone signals Sa indicate that the input potential VIN belongs to the potential zone A. On the contrary, the start timing zone signals Sc of which data are held by the D latch circuit 57 continue indicating that the input potential VIN belongs to the potential zone B. In the stop timing detecting unit 61, therefore, while the signal whose data is held by the D latch circuit 57 and applied to the AND circuit 622 is "H", the signal input to the AND circuit 622 over the signal line 432 turns from "L" to "H", whereby the signal applied from the AND circuit 622 to the OR circuit 64 turns from "L" to "H". Accordingly, the signal input to the CK terminal of the D latch circuit 65 turns from "L" to "H", so that the potential of +5 V supplied from the power supply is taken as a signal "H" into the D latch circuit 65 and the stop signal S2 output from the D latch circuit 65 to the time counting unit 70 turns from "L" to "H". As a result, the count signal C output from the AND circuit 66 turns from "H" to "L", thereby stopping the counting of clock signals in the time counting unit 70.

Thus, the period corresponding to the number of clock signals counted in the time counting unit 70 during the time from the rise of the start signal S1 at time t4 to the rise of the stop signal S2 at time t5, i.e., from the rise of the count signal C at time t4 to the fall thereof at time t5, is indicated as a pulse width in the display 11 of the digital tester 1.

Figure 12A:
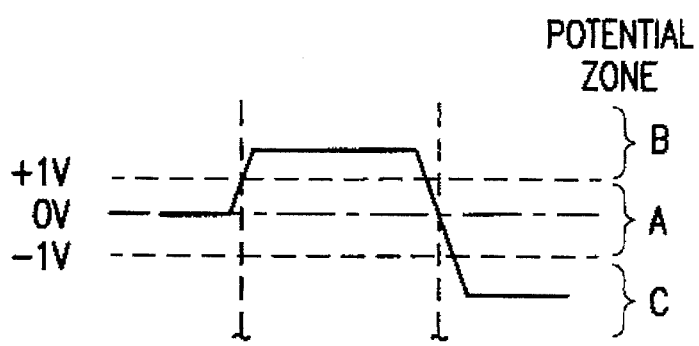
FIGS 12(a) to 12(f) are explanatory views showing waveforms of those input signals that may be input to the digital tester of FIG. 1.
Figure 12B:
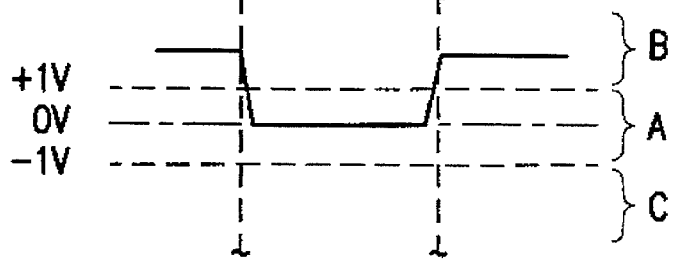
Figure 12C:
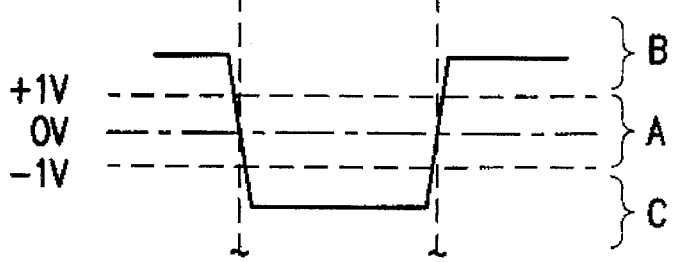
Figure 12D:
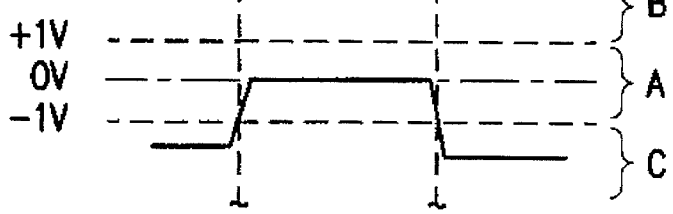
Figure 12E:
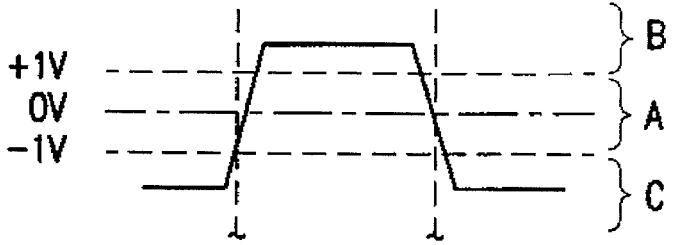

In the case of such a waveform that the input potential VIN falls to the potential zone C through the potential zone A at time t5, as shown in FIG. 12(a), even when the input potential VIN falls so sharply and its passage through the potential zone A cannot be detected, for example, the digital tester normally operates as follows. In the case that the input potential VIN changes from the potential zone A to the potential zone C at time t5, while the start timing zone signals Sc of which data are held by the D latch circuit 57 are in a state of indicating that the input potential VIN belongs to the potential zone B, i.e., a state that the signal input to the AND circuit 622 is kept "H", the signal output to the AND circuit 622 over the signal line 433 through the OR circuit 631 turns from "L" to "H". As with the above case, therefore, the signal applied from the stop timing detecting unit 61 to the CK terminal of the D latch circuit 65 also turns from "L" to "H", and the count signal C normally turns from "H" to "L", thereby stopping the counting of clock signals in the time counting unit 70. Likewise, a pulse width also can be normally measured for those other input signals having such waveforms that the input potential VIN is in the potential zone B in an initial state, then changes to the potential zone A or C, and thereafter returns to the potential zone B, as shown in FIGS. 12(b) and 12(c), and that the input potential VIN is in the potential zone C in an initial state, then changes to the potential zone A or B, and thereafter returns to the potential zone C, as shown in FIGS. 12(d) and 12(e).

The digital tester 1 of this embodiment further comprises the forced stop command signal generator 80 which can forcibly apply the forced stop command signal St of "H" to the OR circuit 64 of the stop timing detecting unit 61. An operation of externally causing the forced stop command signal generator 80 to issue the forced stop command signal St is effected through a range select button 12b. When a pulse width of the input signal is so long as abnormal, for example, it may be desired to suspend the pulse width measurement in its course. By depressing the range select button 12b in such a case, i.e., by depressing the range select button 12b under a condition that the start signal S1 is being output (i.e., under the counting of clock signals by the counter 71), a signal "H" is forcibly applied as the forced stop command signal St to the OR circuit 64 from the forced stop command signal generator 80. Therefore, even if all the four AND circuits keep applying signals "L" to the OR circuit 64, the signal output from the D latch circuit 65 can be turned from "L" to "H" by forcibly applying a signal "H" to the OR circuit 64. As a result, the count signal C output from the OR circuit 66 can be turned from "H" to "L", thereby suspending the pulse width measurement.

Additionally, in the digital tester 1 of this embodiment, depressing the mode sub-select button 12a resets the counter 71. By depressing the range select button 12b in this condition, the pulse width measurement is started and, by depressing the range select button 12b again, a signal "H" is forcibly applied as the forced stop command signal St to the OR circuit 64 from the forced stop command signal generator 80. Accordingly, it is also possible to manually perform the pulse width measurement, Further, since the digital tester 1 of this embodiment has, inside its body 10, a measurement circuit such as a resistance measuring circuit provided with buffer amplifiers and selectors for selecting a reference potential and a reference resistance suitable to resistance measurement depending on each of measurement modes, the circuit corresponding to some of the functions incorporated in NJU 9210 made by New Japan Radio Co., Ltd., a current value and a resistance value can be converted into a voltage value. Therefore, a time interval between changes in a current or resistance value also can be measured. In other words, the ON- or OFF-duration time of a relay for use with control machines can be measured by detecting changes in a current or resistance value.

DIGITAL TESTER OUTER CONSTRUCTION

Referring to FIGS. 1–3(e), the digital tester 1 of this embodiment comprises a body 10 formed of two plastic body cases bonded to each other, and a pair of probes 20a, 20b. These probes 20a, 20b respectively have metal measuring terminals 21a, 21b on one end and test leads 22a, 22b on the other end. The measuring terminals 21a, 21b are electrically conducted with respect to the digital tester body 10 through the test leads 22a, 22b. Plastic grips 23a, 23b of the probes 20a, 20b are provided with flanges 24a, 24b for safety at respective positions closer to their distal ends. On an upper surface of the digital tester body 10, there are provided: a display 11 for indicating the measurement result, a mode subselect button 12a (shift button), a range select button 12b (range button), a measurement mode select rotary switch 13, and so on. Around the measurement mode select rotary switch 13, there are arranged a mark 14a for selecting an OFF state, a mark 14b for selecting voltage measurement, a mark 14c for selecting frequency measurement, a mark 14d for selecting resistance measurement, an AC/DC auto change mark 14e, etc. By rotating the measurement mode select rotary switch 13, any desired measurement mode can be selected. Also, by depressing the mode sub-select button 12a under a condition that the measurement mode select rotary switch 13 is set to the mark 14c for selecting frequency measurement, the function of measuring a pulse width of the input potential can be selected as detailed earlier. Further, by keeping the mode sub-select button 12a depressed for 2 or more seconds under a condition that the pulse width measurement function is selected, the mode is restored to the function of measuring frequency.

On an upper surface of the measurement mode select rotary switch 13, there are formed a plurality of anti-slip small bosses 132 in the circumferential direction near its outer peripheral edge with a predetermined pitch, so that a user can easily rotate the measurement mode select rotary switch 13 while pressing the inner surface of his or her finger against the upper surface of the rotary switch 13. Also, adopting the small bosses 132 for the purpose of preventing finger slips contributes to reduce a thickness of the rotary switch and realize the thinner digital tester body 10. The pitch at which the small bosses 132 and a rotary-side mark 131 are formed on the upper surface of the measurement mode select rotary switch 13 is set to a different value from the pitch at which the marks 14a, 14b . . . are formed on the upper surface of the digital tester body 10, so that the small bosses 132 are always offset from the positions of the marks 14a, 14b, . . . in any measurement mode selected, thereby keeping the user from making false recognition of the measurement mode selected. On the upper surface of the digital tester body 10, there is further formed an upper recess 15 extending from one side of an area in which the measurement mode select rotary switch 13 is formed, to an upper side of the digital tester body 10. Thus, the measurement mode select rotary switch 13 provides a step formed in the direction of thickness between the switch surface and the upper recess 15, enabling the user to surely catch the measurement mode select rotary switch 13 at the finger's inner surface.

Figures 14A, 14B:
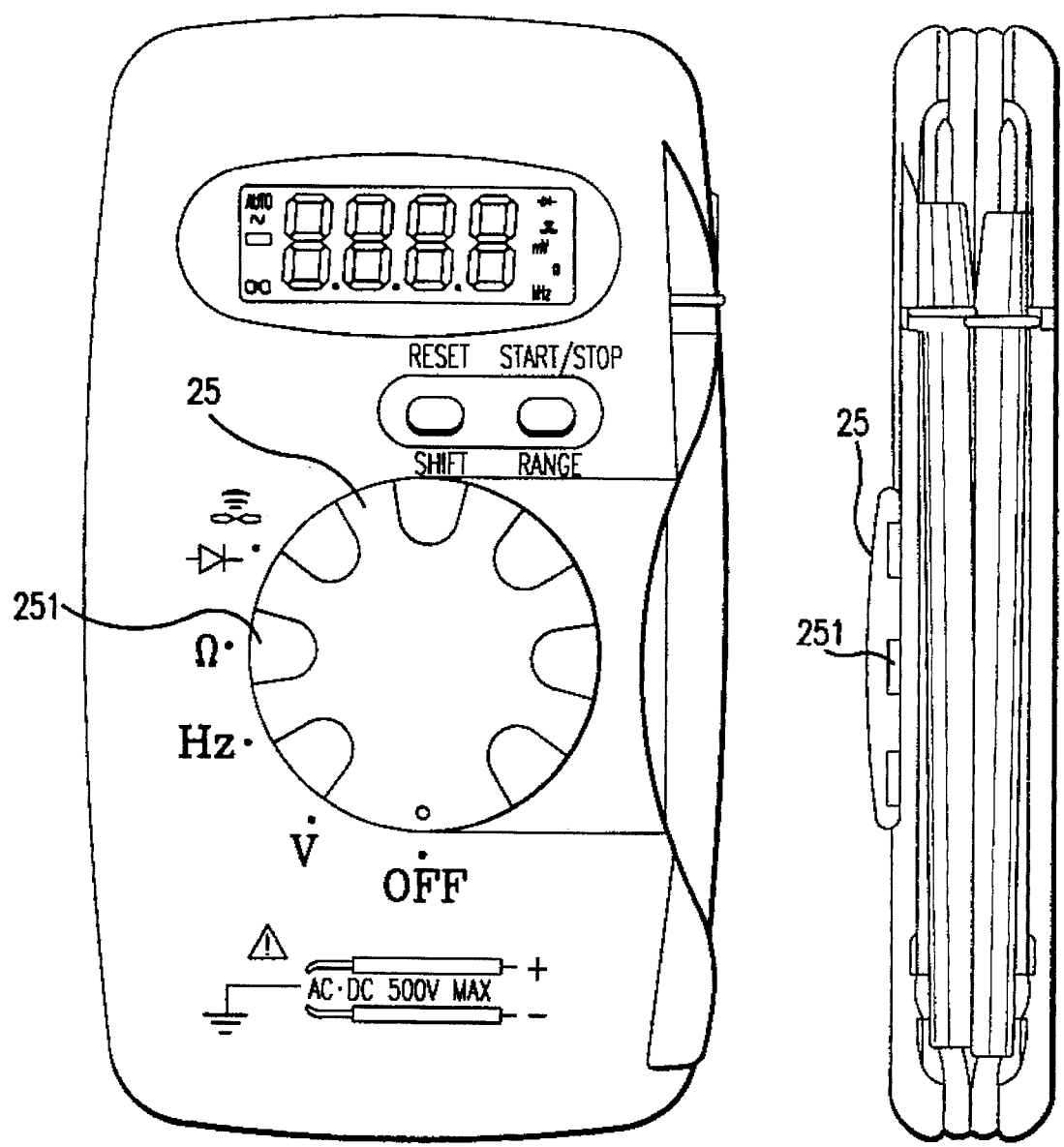
FIG. 14(a) is a front view of a digital tester according to a modified embodiment, for explaining an advantage of the configuration of a measurement mode select switch of the digital tester of FIG. 1.
FIG. 14(b) is a right side view thereof.
Figure 1:
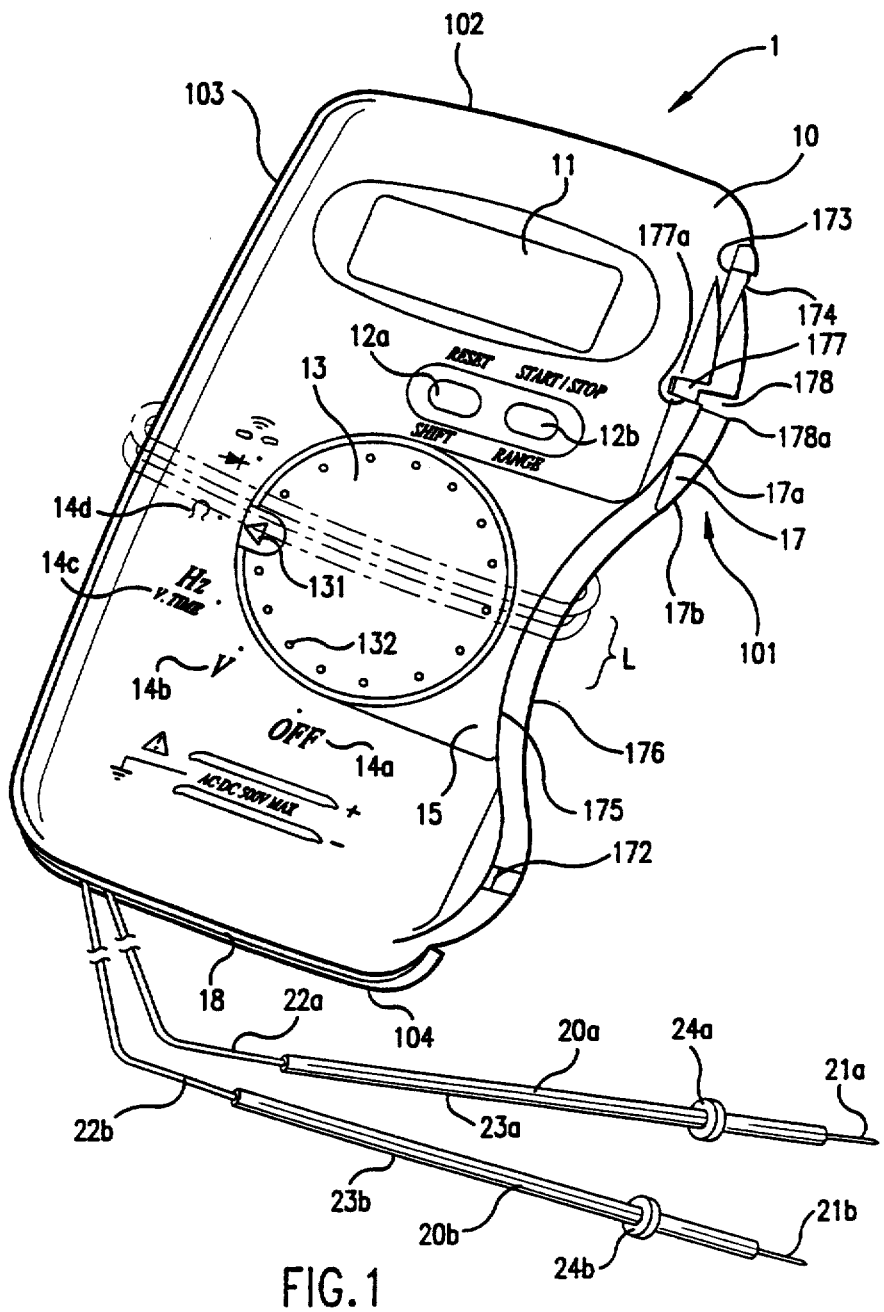

FIGS. 14(a) and 14(b) are plan and right side views, respectively, of another embodiment in which recess portions 251 are provided on a rotary switch 25, instead of small bosses 132, in order to assist gripping of rotary switch 25. Thus, it is possible to rotate the rotary switch 25 so as to select a measurement mode using one's finger. Although rotary switch 25 may be thicker than rotary switch 13 having small projections 132, the tester 10 still has a reduced thickness compared to testers having projecting knob portions.

The digital tester 1 of this embodiment also has peripheral grooves formed in side surfaces of the digital tester body 10. These grooves include a probe storing groove 17 formed in a right side surface 101 for storing the two probes 20a, 20b in parallel, and a test lead storing groove 18 formed in an upper side surface 102, a left side surface 103 and a lower side surface 104 for storing the two test leads 22a, 22b in parallel. The probe storing groove 17 is sized large enough to store the two test leads 22a, 22b in parallel as well as the two probes 20a, 20b. This means that after wrapping the test leads 22a, 22b around the four side surfaces of the digital tester body 10 to be stored in the probe storing groove 17 and the test lead storing groove 18, the probes 20a, 20b can be stored in the probe storing groove 17.

The probe storing groove 17 has elastically contacting engagement portions 171, 172 formed to inwardly project from opposite side walls 17a, 17b defining the probe storing groove 17 therebetween for coming into elastic contact with outer peripheral surfaces of the probes 20a, 20b (in the proximal side of the grips 23a, 23b) stored in the probe storing groove 17. The elastically contacting engagement portions 171, 172 are able to elastically contact and engage the outer peripheral surfaces of the probes 20a, 20b stored in the probe storing groove 17 due to its own elastic deformation and elastic deformations of the opposite side walls 17a, 17b, and hence function as a slip-off preventive mechanism for preventing the probes 20a, 20b from slipping off from the probe storing groove 17.

Figure 2:
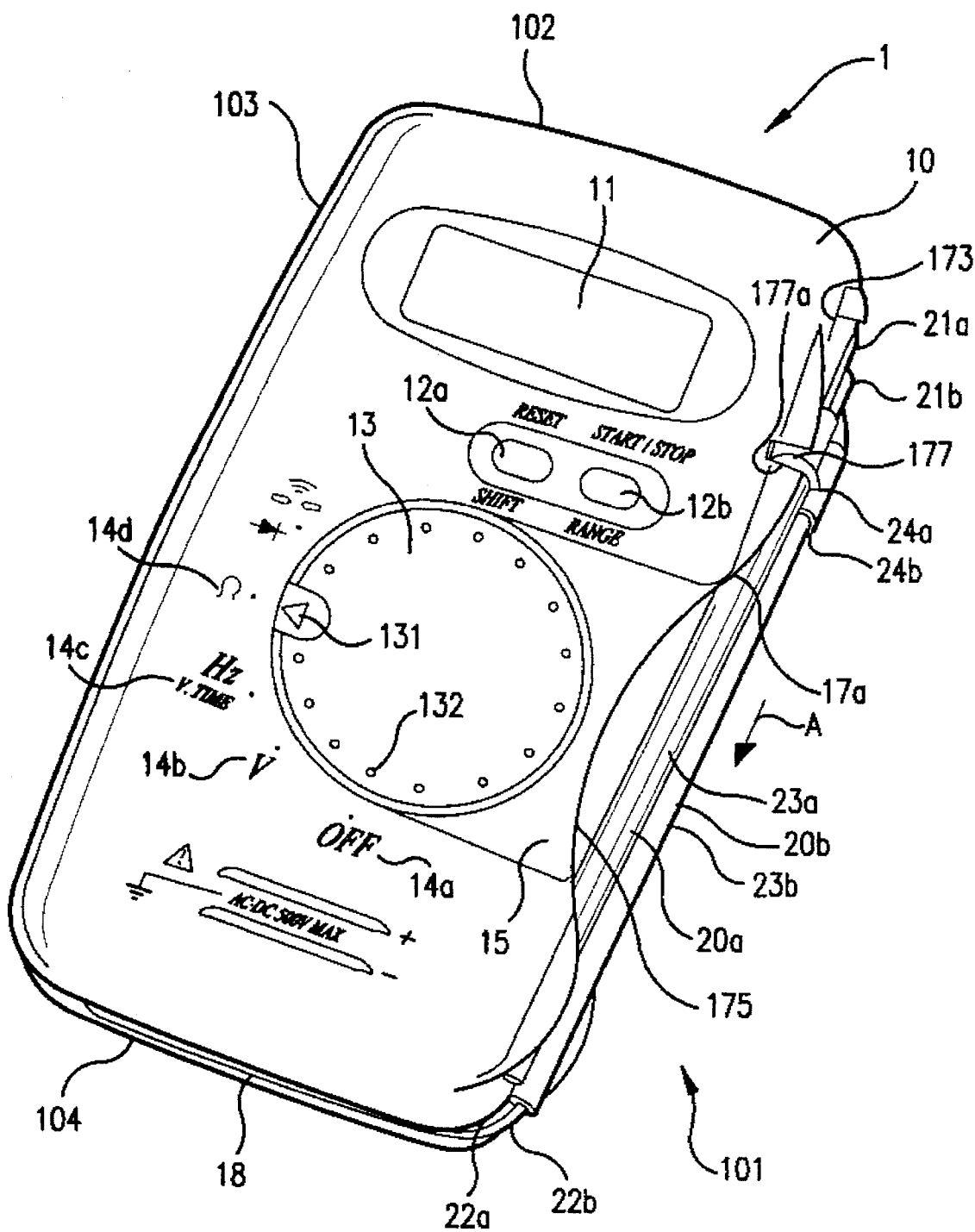
FIG. 2 is a perspective view showing a state of the FIG. 1 digital tester when being carried.
Figure 3A:
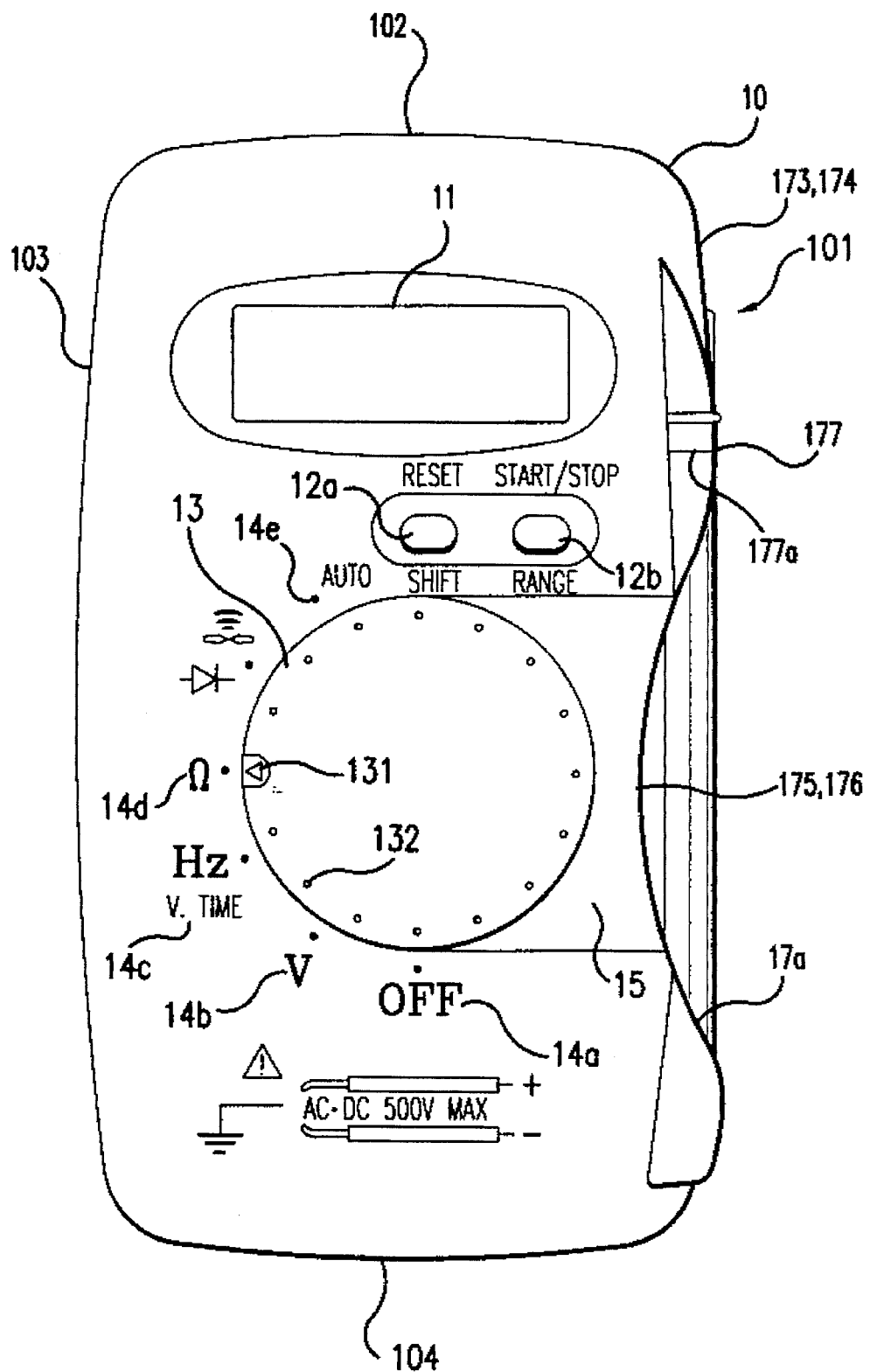
FIG. 3(a) is a front view of the digital tester shown in FIG. 1.
Figure 3B:
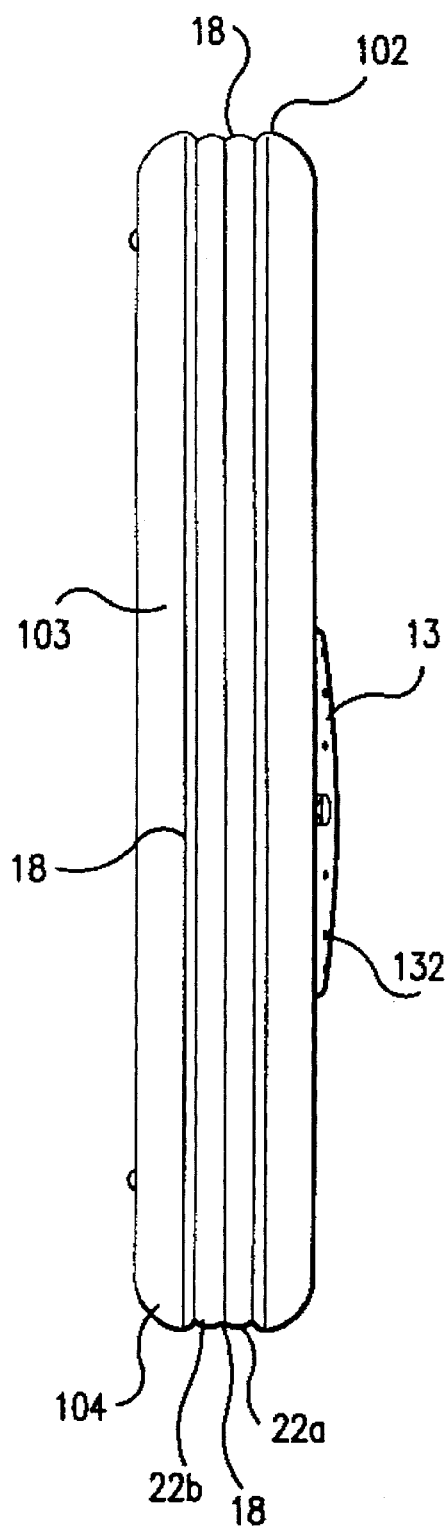
FIG. 3(b) is a left side view thereof.
Figure 3C:
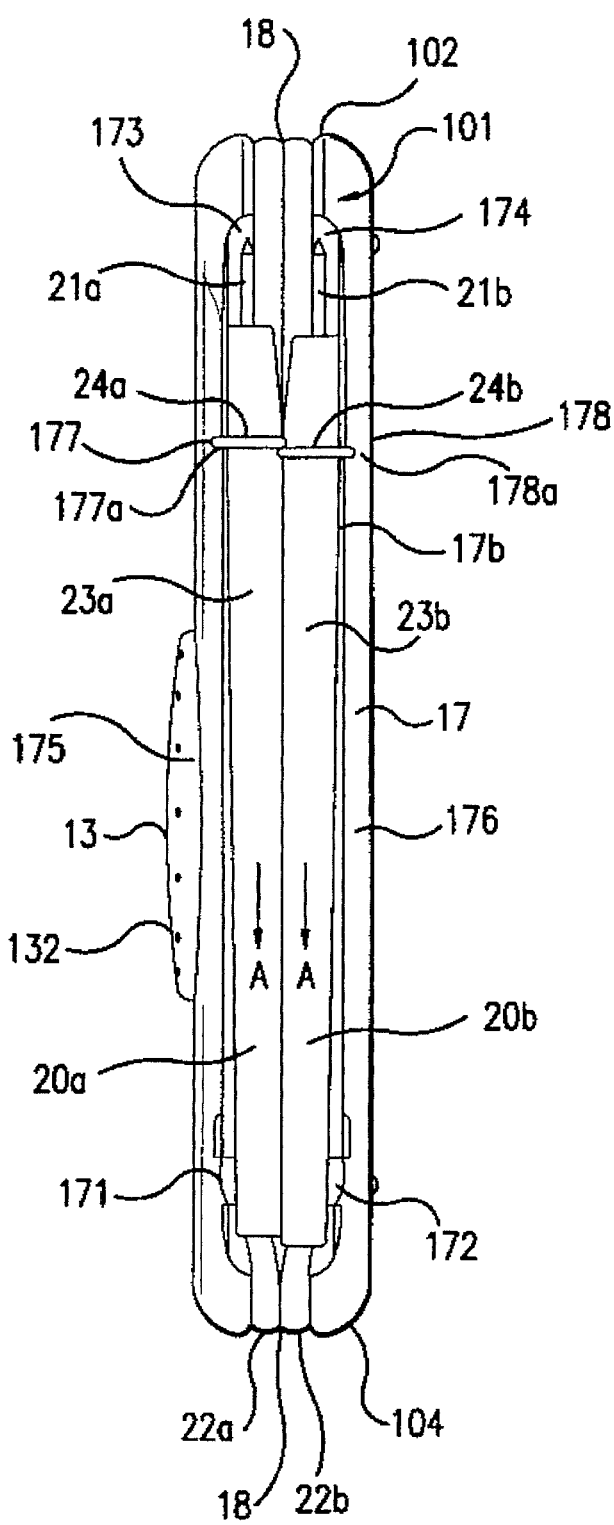
FIG. 3(c) is a right side view thereof.
Figure 3D:
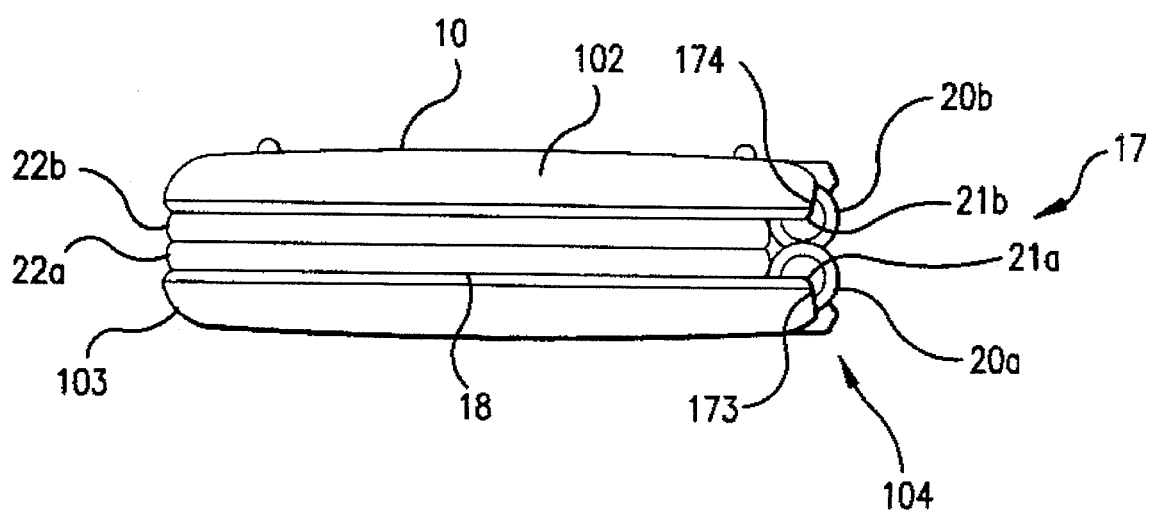
FIG. 3(d) is a top view thereof.
Figure 3E:
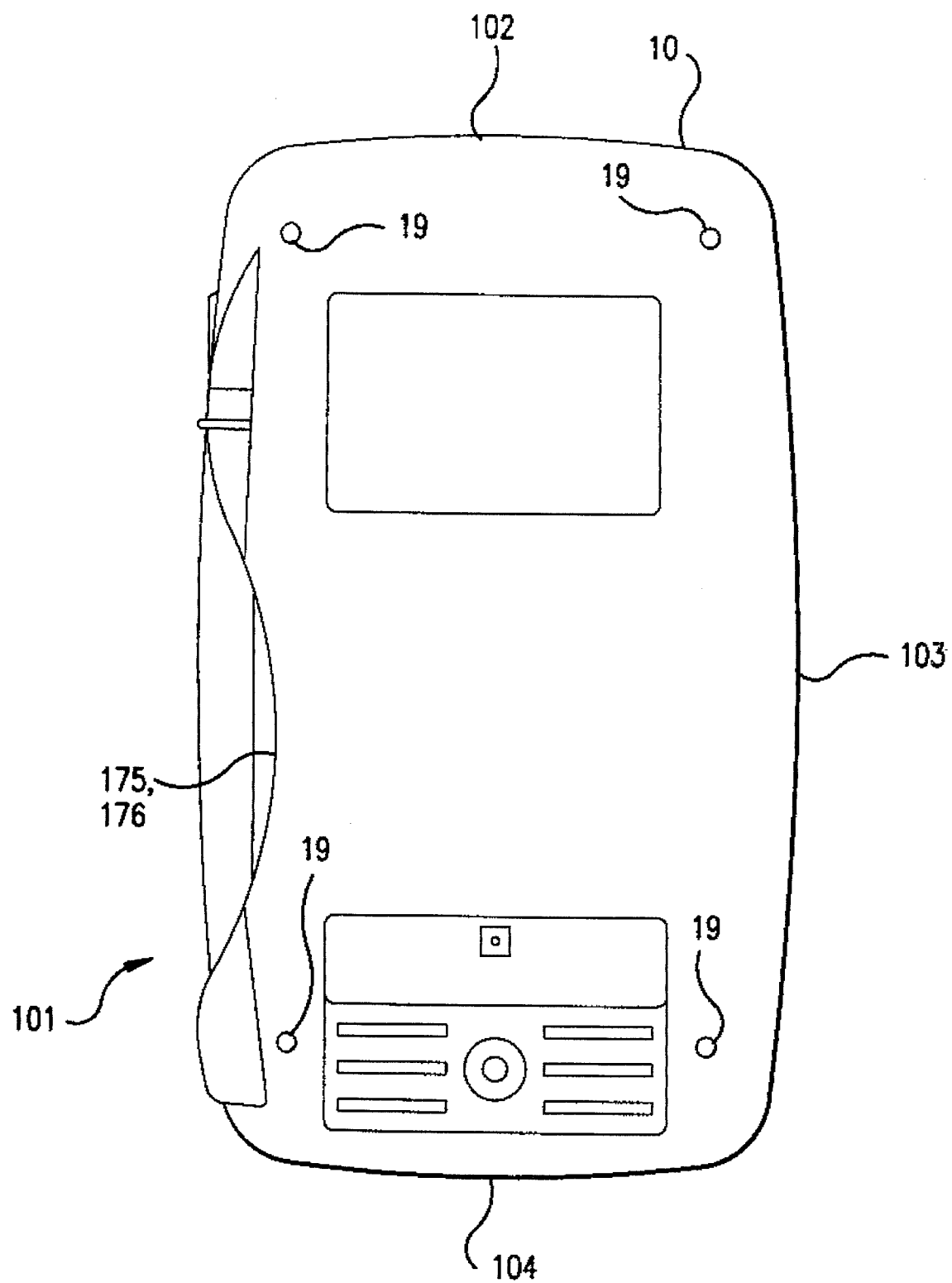

Further, as shown in FIGS. 2 and 3(a), in those portions of the opposite side walls 17a, 17b defining the probe storing groove 17 therebetween where the measuring terminals 21a, 21b are positioned when the probes 20a, 20b are stored in the probe storing groove 17, there are formed measuring terminal exposure recesses 173, 174 extending inwardly from respective open wall edges, through which recesses the measuring terminals 21a, 21b of the probes 20a, 20b stored in the probe storing groove 17 are made exposed to the exterior. Even with the probes 20a, 20b remaining stored in the probe storing groove 17, therefore, the measuring terminals 21a, 21b are both kept exposed so that the measuring terminals 21a, 21b can be brought into electrical contact with terminals of a system under measurement when they are in the stored state, to enable measurement without removing the probes 20a, 20b.

In those portions of the opposite side walls 17a, 17b defining the probe storing groove 17 therebetween where the grips 23a, 23b are positioned when the probes 20a, 20b are stored in the probe storing groove 17, there are formed probe take-out recesses 175, 176 extending inwardly from respective open wall edges, through which recesses the grips 23a, 23b of the probes 20a, 20b stored in the probe storing groove 17 are made exposed. The user can easily pick up the probes 20a, 20b by inserting the finger tips into the probe take-out recesses 175, 176.

Figure 1:
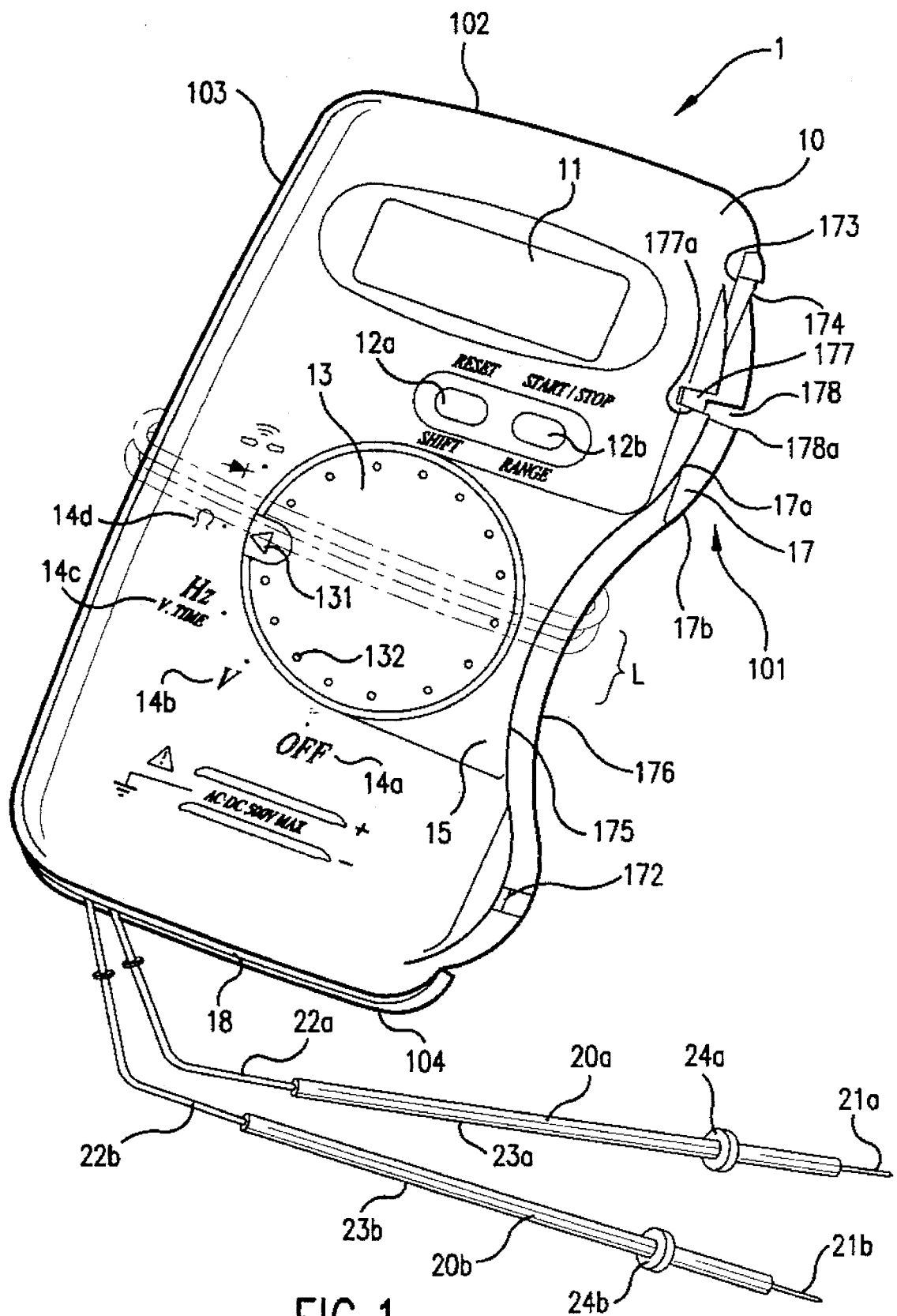
FIG. 1 is a perspective view showing a state in use of a digital tester according to an embodiment of the present invention.

As indicated by dotted lines L in FIG. 1, the test leads 22a, 22b can be wrapped around the circumference of the digital tester body 10 by utilizing the probe take-out recesses 175, 176 for temporarily carrying the digital tester 1. Thus, the above structure also contributes to improve functionality of the digital tester 1.

In those portions of the opposite side walls 17a, 17b defining the probe storing groove 17 therebetween where the flanges 24a, 24b are positioned when the probes 20a, 20b are stored in the probe storing groove 17, there are formed interference preventive recesses 177, 178 extending inwardly from respective open wall edges for avoiding interference between the flanges 24a, 24b of the probes 20a, 20b stored in the probe storing groove 17 and the opposite side walls 17a, 17b. With that structure, when storing the probes 20a, 20b in the probe storing groove 17, there will not occur interference between the flanges 24a, 24b and the opposite side walls 17a, 17b. Moreover, as seen from FIGS. 2 and 3(a), under a condition that the test leads 22a, 22b are wrapped around the four side surfaces of the digital tester body 10 to be stored in the probe storing groove 17 and the test lead storing groove 18 and the probes 20a, 20b are then stored in the probe storing groove 17, the stored probes 20a, 20b are held in place due to elastic contact forces of the elastically contacting engagement portions 171, 172, while tensile forces acting on the probes 20a, 20b through the test leads 22a, 22b (in the direction of arrows A) serve as retaining forces with which the flanges 24a, 24b are surely engaged against lower edges 177a, 178a of the interference preventive recesses 177, 178.

Additionally, small support bosses 19 are formed on a rear surface of the digital tester body 10 at four corners to ensure stability when the digital tester body 10 is put on a table or the like.

As described above, the digital tester 1 of this embodiment comprises the AC/DC determining unit 36 for issuing the determination signal 92 indicating the input signal to be AC upon judgment based on the AC/DC determination signal output from the high-speed A/D converter 35 that a level of the input signal 90 has exceeded the DC determination range of −3 V to +3 V on both the positive and negative sides for a predetermined period, and the switching unit 32 for switching over the measurement system between the AC side and the DC side in response to the determination signal 92. In the digital tester 1, therefore, the measurement system can be automatically switched over between the AC side and the DC side based upon the input signal 90. Further, since the high-speed A/D converter 35 of sequential comparison type is employed as an A/D converter for outputting the AC/DC determination signal 91, a response in switching over the measurement system is high. While AC/DC determination made by using the high-resolution A/D converter 37, for example, would require about 0.3 to 0.4 sec, such AC/DC determination can be performed in about 20 msec by using the high-speed A/D converter 35.

Since the reset signal generator 38 outputs the reset signal to the high-resolution A/D converter 37 when the input signal 90 changes over from AC to DC, the high-resolution A/D converter 37 suspends its processing operation in response to the reset signal and restores itself to the initial state. Accordingly, the high-resolution A/D converter 37 can start the processing operation with a high response for the new input signal 90 after being changed over, resulting in a high response in the measurement.

Further, the processing from step ST2 to step ST4 and the processing from step ST5 to step ST7 are repeated as the process A and the process B, respectively, to compare the level of the input signal 90 with the DC determination range twice at a predetermined time interval; and the input signal 90 is determined to be AC when the level of the input signal 90 has exceeded the DC determination range on both the positive and negative sides in each of the two comparison periods. Therefore, the judgment is never effected only based on a result of the determination made at a transition, thus surely preventing DC from being falsely taken as AC.

While the DC determination range is set to a range of −3 V to +3 V in this embodiment, this range should be set to optimum values depending on the use of the digital tester 1, etc. and absolute values of the thresholds may be different from each other between the positive side and the negative side. Additionally, the digital tester may be arranged to set the DC determination range externally.

Since a current value can be converted into a voltage value just by adding reference resistance (which is intrinsically required to provide the current mode) for current measurement, a current can also be similarly measured in a high-speed and automatic manner by determining whether an input current is DC or AC.

Figure 12F:
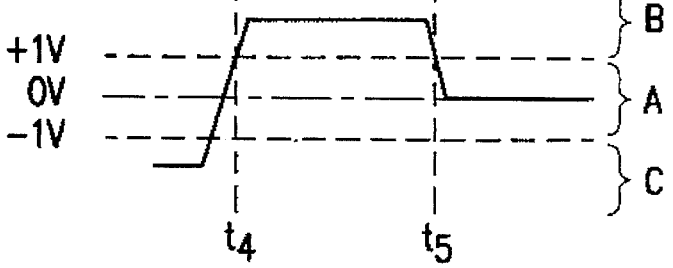

As described above, in the digital tester 1 of this embodiment, based on the potential zone signals Sa indicating to which one of the potential zones A, B, C the input potential VIN belongs, these potential zones being defined by the two reference potentials of +1 V and −1 V, rise and fall of the input potential VIN are detected to decide the times to start and stop the pulse width measurement. Therefore, the circuit for measuring a pulse width can be constructed with a simple circuit configuration. Also, since mixing of noise will not cause a malfunction so long as a noise potential does not exceed the reference potential, a pulse width can be measured with high reliability. For an input signal having such a waveform that the input potential VIN is in the potential zone C in an initial state, then changes to the potential zone B, and thereafter returns just to the potential zone A, by way of example, as shown in FIG. 12(f), the pulse width measurement is not stopped because the input potential VIN does not exceed the reference voltage of −1 V which has been exceeded for the first time. Accordingly, in the event noise or other disturbance causes meaningless change-over of the potential zone from one to another, there will not occur any malfunction. Further, even when the input potential VIN changes from the potential zone A to the potential zone C at time t6 after the end of the pulse width measurement, the stop signal S2 remains stored in the D latch circuit 65 as a result of the data holding. Under this condition, so long as the data held in the D latch circuits 51, 57, 65 are not reset by the reset signal R output from the reset signal generator 55, the pulse width measurement is not resumed. Therefore, even with noise or other disturbance applied to the digital tester, the pulse width measurement is not started due to a malfunction. Additionally, since no relay circuits are employed, high resolution is obtained. While conventional circuit meters have a limit in resolution at several μsec, the digital tester 1 of this embodiment can improve resolution to 0.1 μsec, for example.

When it may be desired to suspend the pulse width measurement because of a pulse width of the input signal being abnormally long, such a suspension can be made by forcibly applying the forced stop command signal St to the OR circuit 64 of the stop signal generator 60 from the forced stop command signal generator 80, with the result of good convenience in use.

Figure 13:
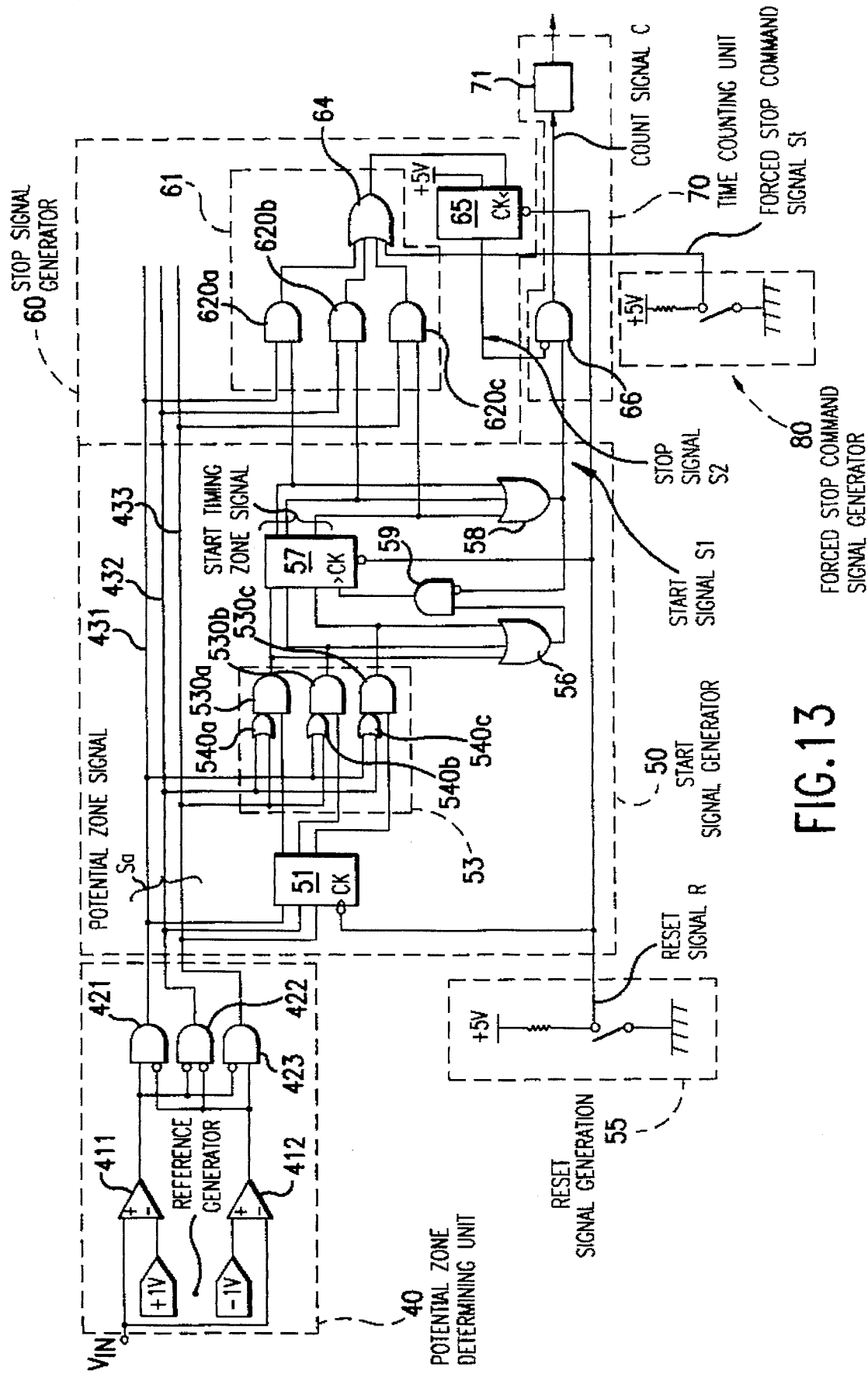
FIG. 13 is a circuit block diagram showing the configuration of a pulse width measuring circuit in the digital tester according to a modified embodiment of the present invention.

It should be noted that the construction explained above is just one embodiment of the digital tester according to the present invention and the circuit configuration shown in FIG. 13, for example, may be adopted as an alternative.

A digital tester according to a modified embodiment shown in FIG. 13 has basically the same construction as that of the digital tester according to the above embodiment, and is different therefrom only in the circuit configurations of the start timing detecting unit 53 of the start signal generator 50 and the stop timing detecting unit 61 of the stop signal generator 60. Therefore, the following description will be given of only the circuit configurations of the start timing detecting unit 53 and the stop timing detecting unit 61, and the same parts as those in the above embodiment constituting the other construction are denoted by the same reference numerals and will not be described herein.

Figure 9A:
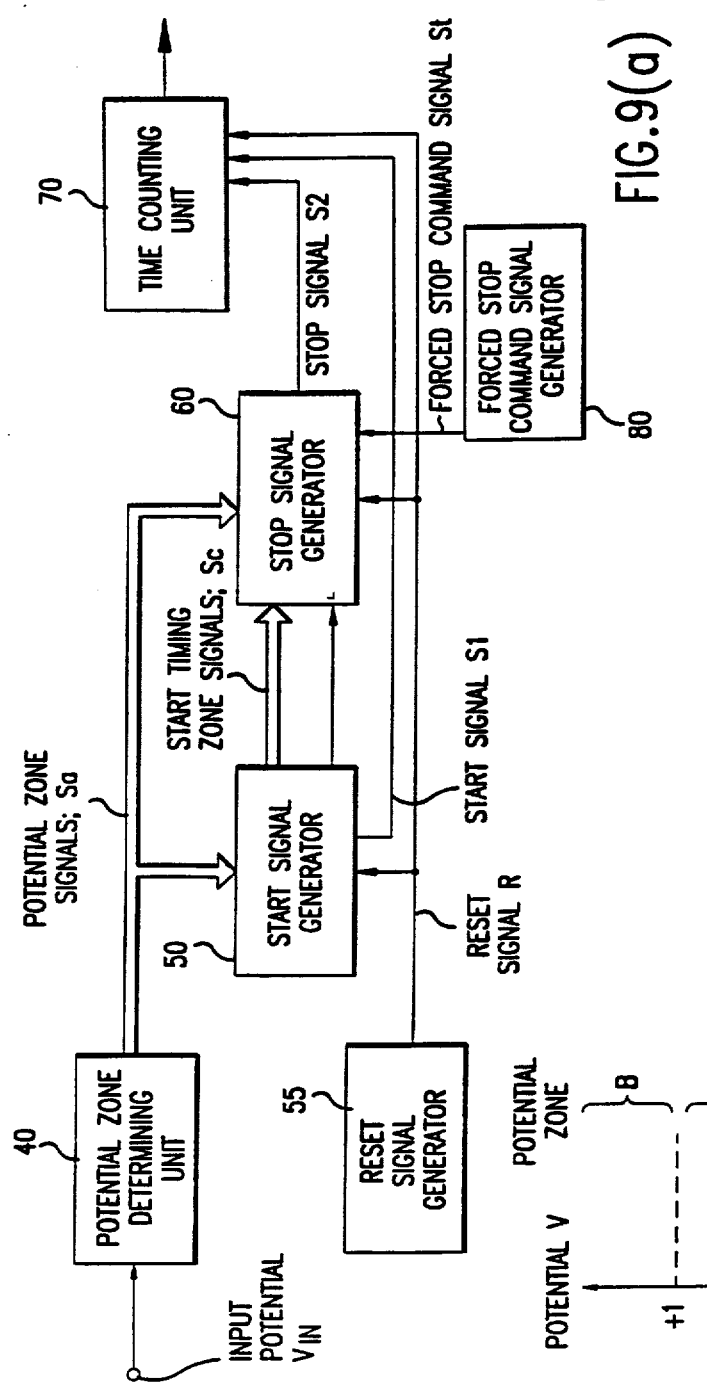
Figure 9B:
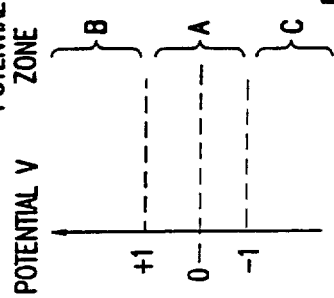
Figure 5:
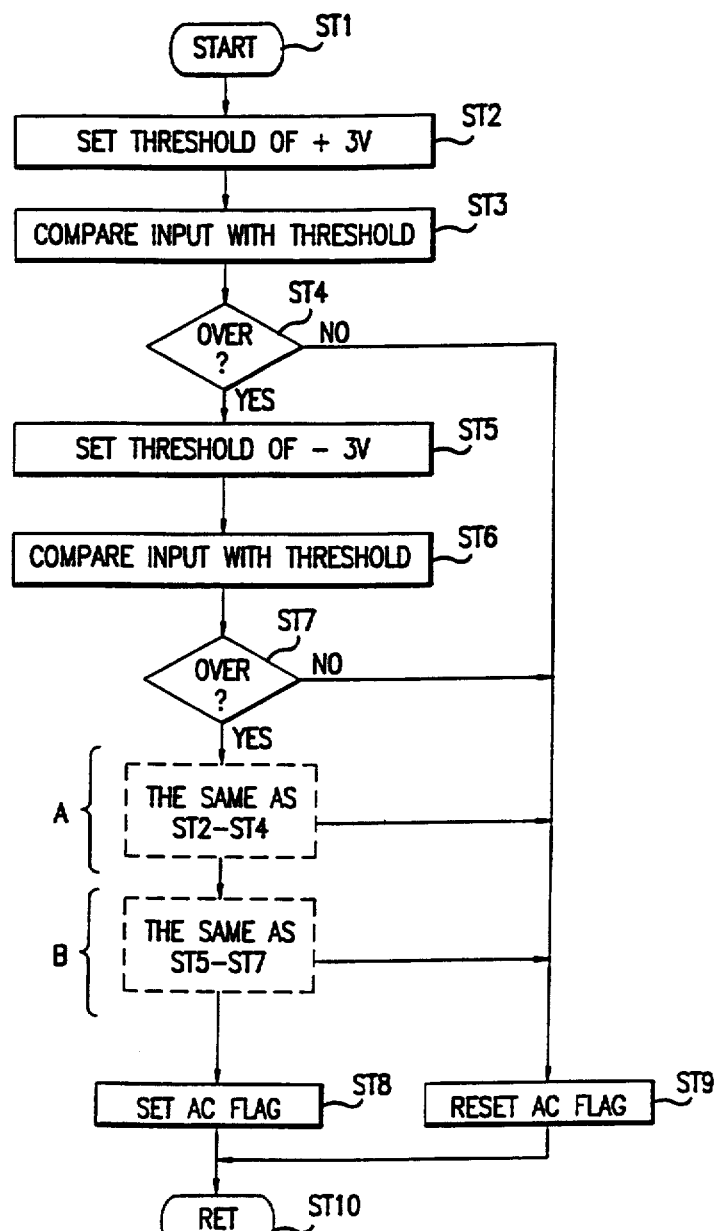
Figure 3E:
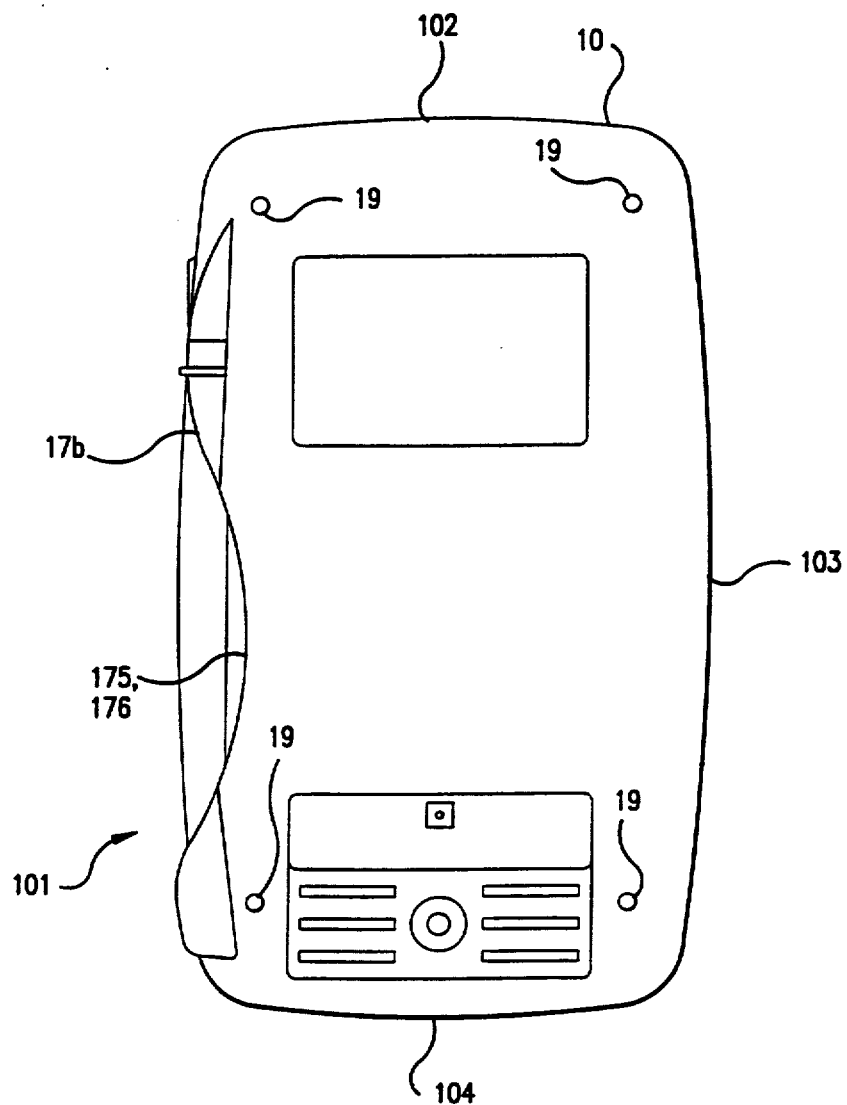

More specifically, in the digital tester shown in FIG. 13, the start timing detecting unit 53 of the start signal generator 50 is constituted by three OR circuits 540a to 540c and three AND circuits 530a to 530c, whereas the stop timing detecting unit 61 of the stop signal generator 60 is constituted by three AND circuits 620a to 620c. The remaining circuit configuration is the same as that of the digital tester shown in FIG. 9.

In the digital tester thus constructed, the start timing detecting unit 53 can detect, based on the potential zone signals Sa output from the potential zone determining unit 40, that the input potential VIN has changed from one potential zone immediately after the reset to a different potential zone, and output the start signal S1. Also, the stop timing detecting unit 61 can detect, based on both the start timing zone signals Sc of which data are held in the D latch circuit 57 and the potential zone signals Sa output from the potential zone determining unit 40, that after output of the start signal S1 from the start signal generator 50, the input potential VIN has returned to the original potential zone by exceeding that reference potential again which was exceeded for the first time, and output the stop signal S2.

While the pulse width detecting function can be realized in the form of a digital circuit as with the above embodiment and the modification thereof, programs stored in the microcomputer may be used to determine the potential zone of the input potential, detect change-over from one to another potential zone, and output the start signal and the stop signal. In this case, the digital tester may be arranged to determine as to whether the input potential has exceeded the reference potential depending on the presence or absence of a flag instead of using the D latch circuit. Values of the reference potentials are not limited to +1 V, −1 V set in the above embodiment and may be variable by providing reference potential setting means such as a trimmer.

Furthermore, in the digital tester 1 of this embodiment, when the probes 20a, 20b are stored in the probe storing groove 17 formed in the right side surface 101 of the digital tester body 10, those probes 20a, 20b are prevented from slipping off from the probe storing groove 17 because of the provision of the slip-off preventive mechanism utilizing the elastically contacting engagement portions 171, 172 and so on, allowing the digital tester 1 to be carried with the probes kept in such a stored state. Accordingly, the probes 20a, 20b are no longer required to be stored in a box case or the like each time the digital tester 1 is carried with the user and, when using the digital tester 1, it can be used just by and immediately after removing the probes 20a, 20b out of the probe storing groove 17, thereby making the digital tester 1 more handy to use. In addition, the digital tester 1 of this embodiment is formed with the test lead storing groove 18 as well as the probe storing groove 17. When carrying the digital tester 1, therefore, after the test leads 22a, 22b are wrapped around the four side surfaces of the digital tester body 10 to be stored in the probe storing groove 17 and the test lead storing groove 18 while keeping the test leads in parallel, the probes 20a, 20b can be stored in the probe storing groove 17, as shown in FIGS. 2 and 3(a) to 3(e). As a result, the probes 20a, 20b and the test leads 22a, 22b can be both brought into a stored state without utilizing any box case, thus making the probes 20a, 20b and the test leads 22a, 22b easier to handle and more convenient to use.

As fully described above, the digital tester according to the present invention is featured in that AC/DC determining means compares a level of an input signal with a DC determination range based on an AC/DC determination signal output from high-speed A/D converter means and determines as to whether the input signal is AC or DC, and switching means switches over a measurement system between the AC side and the DC side in response to a determination signal output from a result of the AC/DC determination. With the present invention, therefore, whether the input signal is AC or DC is automatically determined and the measurement system is automatically switched over, so that even those persons who do not have much electrical knowledge can make measurement under conditions corresponding to an AC or DC input signal. While an A/D converter means for measurement is required to have a high resolution, a high-speed A/D converter means is employed as the A/D converter means for outputting the AC/DC determination signal. This results in a high response in switching over the measurement system.

In the case that the level of the input signal is compared with the DC determination range at least twice at a predetermined time interval, the AC/DC determining means does not determine whether the input signal is AC or DC only based on the comparison made at a transition, thus ensuring positive AC/DC determination.

For the digital tester having reset signal generator means for outputting a reset signal when the input signal changes over between AC and DC, even if a high-resolution A/D converter means of double integral type is used to output a measurement signal, this A/D converter means can be restored to an initial state in its processing operation by using the reset signal, resulting in a high response in the measurement.

Further, as fully described above, the digital tester of the present invention is featured in that whether an input potential has exceeded a reference potential and changed from one to another different potential zone is detected based on potential zone signals output from potential zone determining means; and start signal generator means and stop signal generator means respectively output a start signal and a stop signal for measurement of a pulse width. With the present invention, therefore, since circuits for processing an input signal through time sharing and sequential comparison, as well as relay circuits are not required, a pulse width can be measured with simple construction, high resolution and high reliability in that even if noise or other disturbance is mixed into the input signal, the measurement will not be affected so long as the input potential does not exceed the reference potential.

When a pulse width is abnormally long and a user desires to suspend measurement of the pulse width, the measurement can be suspended by a forced stop command signal output from forced stop command signal generator means, resulting in good convenience in use.

Moreover, as fully described above, in the digital tester of the present invention probes can be stored in a probe storing groove of a body of the digital tester, and a slip-off preventive mechanism utilizing elastically contacting engagement portions and so on is provided in the probe storing groove. With the present invention, therefore, the probes can be prevented from slipping off from the probe storing groove, allowing the digital tester to be carried with the probes kept in a stored state. Accordingly, the probes are no longer required to be stored in a box case or the like each time the digital tester is carried with the user and, when using the digital tester, it can be used just by and immediately after removing the probes out of the probe storing groove, thereby making the digital tester more handy to use.

For the digital tester being formed with the test lead storing groove as well as the probe storing groove, after wrapping test leads around four side surfaces of the digital tester body to be stored in the probe storing groove and the test lead storing groove, the probes can be stored in the probe storing groove, thus making the test leads easier to handle and more convenient to use.

For the digital tester being formed with measuring terminal exposure recesses in opposite side walls which define the probe storing groove therebetween, measuring terminals of the probes are kept exposed to the exterior in a stored state. Therefore, the measurement can be performed by using the measuring terminals even with the probes remaining stored in the probe storing groove. Also, for the digital tester being formed with probe take-out recesses in the opposite side walls, grips of the probes are kept exposed to the exterior in a stored state, enabling the user to easily take out the probes stored in the probe storing groove.

For the digital tester provided with small bosses on the surface of a measurement mode select rotary switch, the user's finger is prevented from slipping without increasing a thickness of the rotary switch. By setting the pitch at which the small bosses are formed circumferentially to be different from the pitch at which measurement mode select marks are formed circumferentially, the small bosses are not aligned with the measurement mode select marks in any measurement mode, thereby keeping the user from making false recognition of the measurement mode selected.

Additionally, for the digital tester formed with an upper recess in the upper surface of the body, the user can easily catch and rotate the measurement mode select rotary switch using their finger tip.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A digital tester comprising:

analogue-to-digital converter means, operating at a high speed, for converting an input signal into a digital signal and outputting said digital signal as an AC/DC determination signal;

AC/DC determining means, receiving said AC/DC determination signal, for comparing said AC/DC determination signal with a predetermined DC determination range defined by positive and negative thresholds, and for determining said input signal to be AC when said AC/DC determination signal exceeds said DC determination range by exceeding both the positive and negative thresholds for a predetermined comparison period, said AC/DC determining means outputting a determining signal based on whether said input signal is determined to be AC;

a measurement system having an AC side and DC side, and switching means coupled to said measurement system and determining means for switching said measurement system between said AC side and said DC side in response to said determining signal.

2. A digital tester according to claim 1, wherein said AC/DC determining means compares said AC/DC determination signal with said DC determination range at least twice during a predetermined time interval, and judges said input signal to be AC when said AC/DC determination signal has exceeded said DC determination range by exceeding both the positive and the negative thresholds each time said AC/DC determination signal is compared to said DC determination range during said predetermined time interval.

3. A digital tester according to claim 1, wherein said switching means holds said measurement system to either one of the AC side and the DC side as a normal state, and said AC/DC determining means issues, as said determining signal, a switching command signal for switching over said measurement system from said one of the AC side and the DC side as said normal state to another off of the AC side and the DC side when said input signal requires said measurement system to be set to the other side.

4. A digital tester according to claim 3, wherein said switching means sets said measurement system to the DC side in said normal state and switches over said measurement system to the AC side as the other side.

5. A digital tester according to claim 1, further comprising:

high-resolution analogue-to-digital converter means of double integral type for converting said input signal into a digital measurement signal when the measurement system is set to either one of the AC and DC sides; and reset signal generator means for outputting a reset signal to said high-resolution analogue-to-digital converter means when said input signal is changed over between AC and DC by said AC/DC determining means.

6. A digital tester according to claim 1, wherein said measurement system comprises:

a first circuit path extending between an input terminal of the digital tester and a DC terminal and;

a second circuit path extending between said input terminal of the digital tester and an AC terminal, said second circuit path including a rectifying/smoothing circuit;

wherein said switching means is selectively movable between said DC terminal and said AC terminal.

7. A digital tester including measuring terminals for attachment to a circuit to be tested for carrying an input signal from the circuit to be tested, and a measurement system coupled to said measuring terminals for performing tests using the input signal, said measuring system having an AC side and a DC side, said digital tester comprising:

an analogue-to-digital converter, coupled to said measurement terminals, for converting the input signal into a digital AC/DC determination signal;

an AC/DC determining unit, receiving said AC/DC determination signal, said AC/DC determining unit comparing said AC/DC determination signal with a predetermined DC determination range defined by positive and negative thresholds, and determining said input signal to be AC when said AC/DC determination signal exceeds both the positive and the negative thresholds during a predetermined comparison period, said AC/DC determining unit outputting a determining signal based on whether said input signal is determined to be AC; and a switch, coupled between the measurement system and determining unit, said switch receiving said determining signal so as to selectively supply the input signal to one of the AC side and the DC side of the measurement system in response to said determining signal.

8. A digital tester according to claim 7, wherein said AC/DC determining unit compares said AC/DC determination signal with said DC determination range at least twice during a predetermined time interval, and judges said input signal to be AC when said AC/DC determination signal has exceeded said DC determination range by exceeding both the positive and the negative thresholds each time said AC/DC determination signal is compared to said DC determination range during said predetermined time interval.

9. A digital tester according to claim 7, wherein said switch supplies said input signal to either one of the AC side and the DC side in a normal state, and said AC/DC determining unit issues, as said determining signal, a switching command signal for causing said switch to switch over and supply said input signal to an other side when said input signal requires said measurement system to be set to the other side.

10. A digital tester according to claim 9, wherein said switch supplies the input signal to the DC side in said normal state and switches over to supply the input signal to the AC side as the other side.

11. A digital tester according to claim 7, further comprising:

a high-resolution analogue-to-digital converter of double integral type, coupled to said measuring terminals, for converting said input signal into a digital measurement signal when the measurement system is set to either one of the AC and DC sides; and a reset signal generator, coupled to said AC/DC determining unit for outputting a reset signal to said high-resolution analogue-to-digital converter when said input signal is changed over between AC and DC by said AC/DC determining unit.

12. A digital tester according to claim 7, wherein said AC/DC determining unit includes a programmed microcomputer.

13. A digital tester according to claim 7, wherein said measurement system comprises:

a first circuit path extending between an input terminal of the digital tester and a DC terminal and;

a second circuit path extending between said input terminal of the digital tester and an AC terminal, said second circuit path including a rectifying/smoothing circuit;

wherein said switching means is selectively movable between said DC terminal and said AC terminal.

14. A digital tester comprising:

an input terminal;

a first circuit path extending between said input terminal and a DC terminal;

a second circuit path extending between said input terminal and an AC terminal, and including a rectifying/smoothing circuit;

a switch having a switch input selectively engageable with said AC terminal and said DC terminal, and a switch output;

a sequential comparison type analogue-to-digital converter, coupled to said switch output, which converts an input signal received by said input terminal into a digital AC/DC determination signal;

an AC/DC determining unit, coupled to said sequential comparison type analogue-to-digital converter, which receives and compares said AC/DC determination signal with a DC determination range defined by positive and negative thresholds, said AC/DC determining unit determining said input signal to be AC when said AC/DC determination signal exceeds both the positive and the negative thresholds during a comparison period, said AC/DC determining unit outputting a determining signal to said switch based on whether the input signal is determined to be AC;

said switch selectively engaging one of said AC terminal and said DC terminal in response to said determining signal.

15. A digital tester according to claim 14, wherein said AC/DC determining unit compares said AC/DC determination signal with said DC determination range at least twice during a predetermined time interval, and judges said input signal to be AC when said AC/DC determination signal has exceeded said DC determination range by exceeding both the positive and the negative thresholds each time said AC/DC determination signal is compared to said DC determination range during said predetermined time interval.

16. A digital tester according to claim 14, wherein said switch engages the DC terminal unless said AC/DC determining unit has determined said input signal to be AC.

17. A digital Lester according 14, further comprising:

a high-resolution analogue-to-digital converter of double integral type, coupled to said switch output, which converts said input signal into a digital measurement signal; and a reset signal generator, coupled to said AC/DC determining unit, which outputs a reset signal to said high-resolution analogue-to-digital converter when said input signal is changed over between AC and DC by said AC/DC determining unit.

18. A digital tester according to claim 14, wherein said AC/DC determining unit includes a programmed microcomputer.

* * * * *

UNITED STATES PATENT AND TRADEMARK OFFICE
CERTIFICATE OF CORRECTION

PATENT NO. : 5,543,707  Page 1 of 5
DATED : August 6, 1996
INVENTOR(S) : Gen Yoneyama and Eiji Tsukahara It is certified that error appears in the above-indentified patent and that said Letters Patent is hereby corrected as shown below:

IN THE DRAWINGS:

Please substitute the attached four sheets of Figs. 1, 3(e), 5, 9(a) and 9(b) for the corresponding sheets of Figures in the Patent.

Signed and Sealed this

Nineteenth Day of November, 1996

Attest:

BRUCE LEHMAN

Attesting Officer  Commissioner of Patents and Trademarks